United States Patent
Umetani

(10) Patent No.: US 9,753,099 B2
(45) Date of Patent: Sep. 5, 2017

(54) DETECTOR OF MAGNETIC BIAS, MAGNETIC SATURATION, OR AMOUNT OF MAGNETIC FLUX

(71) Applicant: DENSO CORPORATION, Kariya, Aichi-pref. (JP)

(72) Inventor: Kazuhiro Umetani, Nagoya (JP)

(73) Assignee: DENSO CORPORATION, Kariya (JP)

( * ) Notice: Subject to any disclaimer, the term of this patent is extended or adjusted under 35 U.S.C. 154(b) by 391 days.

(21) Appl. No.: 14/108,932

(22) Filed: Dec. 17, 2013

(65) Prior Publication Data

US 2014/0218012 A1   Aug. 7, 2014

(30) Foreign Application Priority Data

Feb. 1, 2013   (JP) .................................. 2013-18642

(51) Int. Cl.
*G01R 33/02* (2006.01)
*G01R 33/12* (2006.01)

(52) U.S. Cl.
CPC .......... *G01R 33/02* (2013.01); *G01R 33/1215* (2013.01)

(58) Field of Classification Search
CPC ............... G01R 33/02; G01R 33/1215; H01F 2029/143; H01F 38/02; H01F 38/30; H01F 21/08; H01F 27/38; H01F 27/42; H01F 27/427; H01F 27/402; H01F 29/14; H01F 29/146; H01F 17/06; G01L 1/127; H02K 1/146; G05F 1/32; G05F 1/325; H02M 1/40

USPC ............................................. 324/117 R, 253
See application file for complete search history.

(56) References Cited

U.S. PATENT DOCUMENTS

| | | | | |
|---|---|---|---|---|
| 2,284,406 A | * | 5/1942 | D Entremont | H01F 27/427 336/170 |
| 3,233,171 A | * | 2/1966 | Yamaguchi | G01R 33/045 324/253 |
| 3,611,330 A | * | 10/1971 | Cacossa | H03K 3/51 363/134 |
| 3,664,187 A | * | 5/1972 | Goransson | G01L 1/127 73/862.69 |

(Continued)

FOREIGN PATENT DOCUMENTS

| | | |
|---|---|---|
| JP | S64-005365 A | 1/1989 |
| JP | H02-077663 A | 3/1990 |

(Continued)

*Primary Examiner* — Tung X Nguyen
*Assistant Examiner* — Lee Rodak
(74) *Attorney, Agent, or Firm* — Posz Law Group, PLC

(57) ABSTRACT

A detector includes a detection winding, a detection winding measurement section, and a detection section. A magnetic core has a hole penetrating the magnetic core along a non-uniform cross section. The detection winding includes a wire inserted into the hole and surrounding a periphery of a detection region that is a part of the non-uniform cross section and has a magnetic flux density different from an average magnetic flux density of the non-uniform cross section. The detection winding measurement section performs a measurement relating to an electromotive force induced by the detection winding. The detection section detects a magnetic bias, a magnetic saturation, or an amount of magnetic flux in the magnetic core based on a measurement result of the detection winding measurement section.

28 Claims, 25 Drawing Sheets

(56) References Cited

U.S. PATENT DOCUMENTS

| | | | | |
|---|---|---|---|---|
| 4,020,440 | A | * | 4/1977 | Moerman .................. G05F 1/38 |
| | | | | 323/250 |
| 4,259,716 | A | * | 3/1981 | Harris ..................... H01F 19/04 |
| | | | | 336/155 |
| 4,307,334 | A | * | 12/1981 | Peil .................... H05B 41/2822 |
| | | | | 315/219 |
| 4,439,822 | A | * | 3/1984 | Cocconi ............. H02M 3/3378 |
| | | | | 363/24 |
| 5,122,947 | A | * | 6/1992 | Hishiki ................. H01F 27/346 |
| | | | | 323/362 |
| 5,287,056 | A | * | 2/1994 | Jackson ................. G01R 33/14 |
| | | | | 324/212 |
| 6,069,474 | A | * | 5/2000 | Aoshima ................ G01G 19/08 |
| | | | | 324/209 |
| 2006/0208603 | A1 | * | 9/2006 | Kerlin .................... H02K 1/146 |
| | | | | 310/261.1 |
| 2014/0232383 | A1 | * | 8/2014 | Peck, Jr. ............... H01F 27/402 |
| | | | | 324/244 |

FOREIGN PATENT DOCUMENTS

| | | |
|---|---|---|
| JP | H11-040429 A | 2/1999 |
| JP | H11-162769 A | 6/1999 |

* cited by examiner

DETECTOR OF MAGNETIC BIAS, MAGNETIC SATURATION, OR AMOUNT OF MAGNETIC FLUX

CROSS REFERENCE TO RELATED APPLICATIONS

The present application is based on and claims priority to Japanese Patent Application No. 2013-18642 filed on Feb. 1, 2013, the contents of which are incorporated in their entirety herein by reference.

TECHNICAL FIELD

The present disclosure relates to a detector of detecting a magnetic bias, a magnetic saturation, or an amount of magnetic flux in a magnetic core.

BACKGROUND

An insulated power supply is provided with a transformer to electrically insulate input and output sides. However, if too much magnetic bias occurs in a magnetic core of the transformer, a loss may increase or the magnetic core may be magnetically saturated to generate an excessive excitation current on windings. Necessary solutions to this problem include controlling voltages and detecting a magnetic bias or an excessive DC magnetic flux generated in the magnetic core to eliminate the magnetic bias and the magnetic saturation.

In a magnetic bias evaluation apparatus described in JP-A-H11-40429, the magnetic core of the transformer is provided with a small π-type magnetic core (bypass magnetic path) made of a material whose magnetic permeability is higher than the magnetic core. In addition, the bypass magnetic path is provided with a detection winding. The bypass magnetic path causes magnetic flux saturation more easily than the magnetic core. Even if a magnetic core flux changes, the detection winding induces a voltage only when the magnetic core flux approximates to 0.

If a magnetic bias occurs in the magnetic core whose magnetic flux changes periodically, a time interval of times at which the magnetic core flux becomes zero differs from a time interval in the normal state. Accordingly, a time interval of times at which a voltage is induced to the detection winding also changes. The magnetic bias evaluation apparatus according to JP-A-H11-40429 detects the magnetic bias by monitoring a time interval of times at which a voltage is induced to the detection winding.

However, the magnetic bias evaluation apparatus described in JP-A-H11-40429 requires providing an additional bypass magnetic path for a transformer core, and a cost increases. In recent years, ferrite is generally used as a material of transformer cores. Because such a core is fragile, when the transformer core is provided with the bypass magnetic path, the strength of the transformer core decreases.

SUMMARY

An object of the present disclosure is to provide a detector of magnetic bias, magnetic saturation, or an amount of magnetic flux in a magnetic core while restricting an increase in cost and a decrease in strength of the magnetic core.

According to an aspect of the present disclosure, a detector of detecting a magnetic bias, a magnetic saturation, or an amount of magnetic flux in a magnetic core around which a coil is wound includes a detection winding, a detection winding measurement section, and a detection section. The magnetic core has a non-uniform cross section in which inhomogeneous distribution occurs in magnetic flux density, when the coil is applied with a voltage to form a magnetic flux. The magnetic core has a hole penetrating the magnetic core along the non-uniform cross section.

The detection winding includes a wire, the wire inserted into the hole of the magnetic core and surrounding a periphery of a detection region. The detection region is a part of the non-uniform cross section and has a magnetic flux density different from an average magnetic flux density of the non-uniform cross section.

The detection winding measurement section performs a measurement relating to an electromotive force induced by the detection winding. The detection section detects the magnetic bias, the magnetic saturation, or the amount of magnetic flux in the magnetic core based on a measurement result of the detection winding measurement section.

The above-described can detect the magnetic bias, the magnetic saturation, or the amount of magnetic flux in the magnetic core while restricting an increase in cost and a decrease in strength of the magnetic core.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Embodiments of the present disclosure will be described with reference to the accompanying drawings. The embodiments of the disclosure are not limited to the following. Various modifications may be made to the embodiments within the technical scope of the present invention.

(First Embodiment)
[Configuration]

Figure 1:
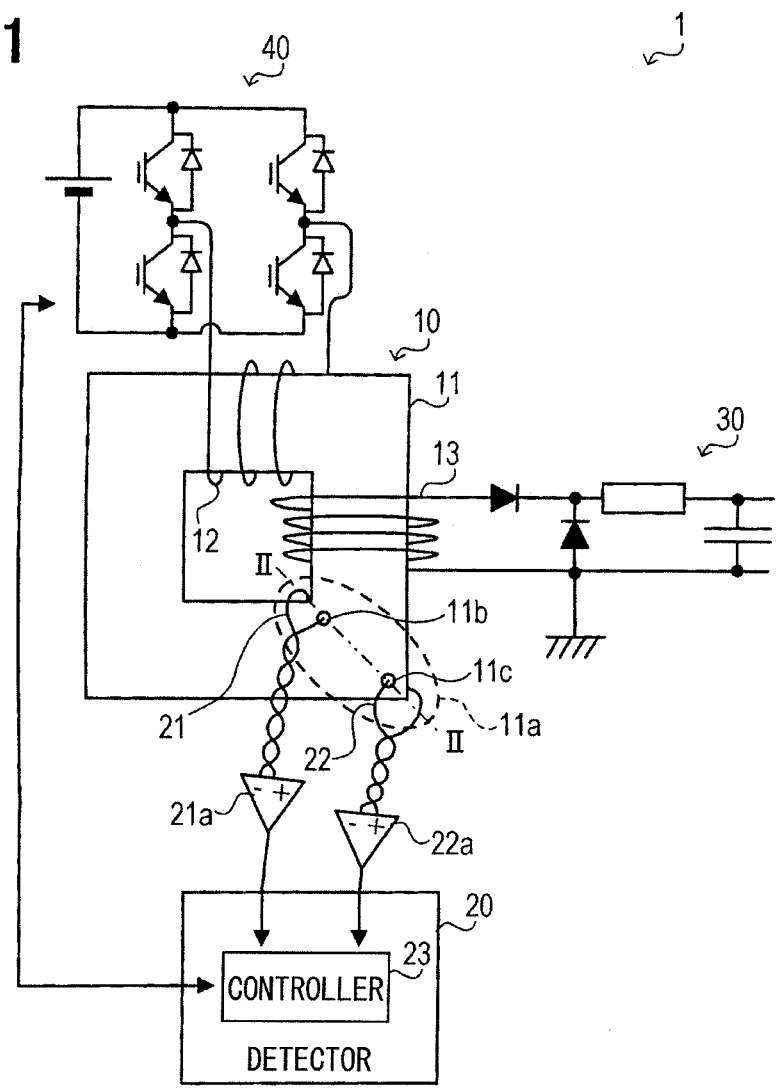
FIG. 1 is an explanatory diagram illustrating a configuration of a transformer and a detector according to a first embodiment.

A configuration of an insulated power supply 1 according to a first embodiment of the present disclosure will be described. As illustrated in FIG. 1, the insulated power supply 1 includes an inverter circuit 40, a transformer 10, a rectifier circuit 30, and a detector 20 to detect a magnetic bias or a magnetic saturation at a magnetic core 11 of the transformer 10.

The inverter circuit 40 includes a power-switching element and generates a periodically changing rectangular wave AC voltage from a DC voltage generated from a DC power supply. The transformer 10 converts the amplitude of AC voltage generated from the inverter circuit 40. The transformer 10 includes a magnetic core 11, a primary winding 12, and a secondary winding 13. The magnetic core 11 is shaped into a rectangular annular structure. The primary winding 12 is supplied with the AC voltage. The secondary winding 13 outputs the converted voltage.

The magnetic core 11 includes a rectangular hollow that penetrates the center. The cross section is formed into a rectangle along the penetrating direction of the hollow. The magnetic core 11 has four corners each of which is bent at 90 degrees. An inner hole 11b and an outer hole 11c are respectively formed at the inner and the outer side of one corner 11a. The magnetic core 11 may be made of ferrite.

The inner and outer holes 11b and 11c vertically penetrate the magnetic core 11 (see FIG. 2) along a cross section (an non-uniform cross section 11d to be described later) taken along line II-II in FIG. 1 and including edges at an inner surface (an external surface inside the magnetic core 11) and an outer surface (an external surface outside the magnetic core 11) of the corner 11a.

The rectifier circuit 30 includes a diode, an inductor, and a capacitor. The rectifier circuit 30 rectifies full waves of an AC voltage converted from the transformer 10. The rectifier circuit 30 is not limited to the configuration as illustrated in FIG. 1 and may be provided as rectifier circuits according to various systems.

The detector 20 includes an inner detection winding 21 provided for the inner hole 11b and an outer detection winding 22 provided for the outer hole 11c. The inner detection winding 21 penetrates the inner hole 11b. The inner detection winding 21 includes a wire wound around a partial region 11dx of an non-uniform cross section 11d positioned between the inner surface and the inner hole 11b of the magnetic core 11. The outer detection winding 22 penetrates the outer hole 11c. The outer detection winding 22 includes a wire wound around a partial region 11dy of the non-uniform cross section 11d positioned between the outer surface and the outer hole 11c of the magnetic core 11. The inner and outer detection windings 21 and 22 are wound around the partial region for an appropriate number of times.

The detector 20 includes amplifier circuits 21a and 22a and a controller 23. The amplifier circuits 21a and 22a amplify induction voltages induced by the inner and outer detection windings 21 and 22. The controller 23 mainly includes a CPU, ROM, and RAM and comprehensively controls the apparatus.

The detector 20 is supplied with a voltage signal that is generated by attenuating an AC voltage supplied to the primary winding 12 from the inverter circuit 40, for example. As will be described in detail later, the controller 23 detects magnetic bias generated in the magnetic core 11 of the transformer 10 based on the voltage signal or the induction voltage induced by the inner and outer detection windings 21 and 22.

When the magnetic saturation on the magnetic core 11 reaches a specified level, the detector 20 transmits a stop signal to the inverter circuit 40 to temporarily stop applying an AC voltage to the primary winding 12.

Figure 3:
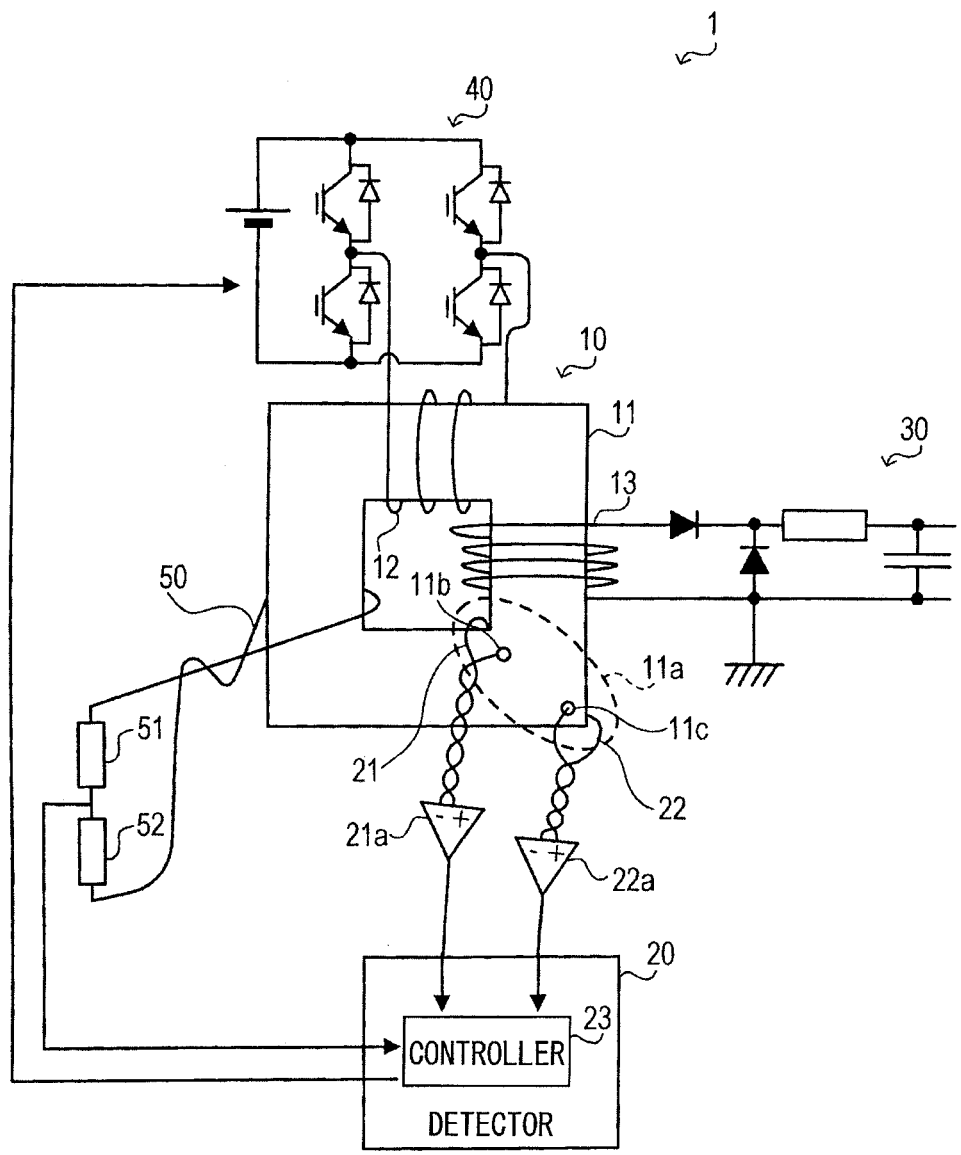
FIG. 3 is an explanatory diagram illustrating an example of a configuration of a transformer and a detector according to the first embodiment.

As illustrated in FIG. 3, the insulated power supply 1 may further include a reference winding 50 and voltage divider resistors 51 and 52. The reference winding 50 is wound around the external surface on the magnetic core 11 of the transformer 10 so as to be interlinked with a magnetic flux formed in the magnetic core 11. The voltage divider resistors 51 and 52 divide an induction voltage induced by the reference winding 50.

The divided induction voltage (reference induction voltage) is supplied to the controller 23 of the detector 20. The controller 23 may detect magnetic bias generated in the magnetic core 11 of the transformer 10 based on the reference induction voltage and the induction voltage induced by the inner and outer detection windings 21 and 22 (to be described in detail later).

[Overview of Magnetic Bias Detection]

The following describes how the detector 20 detects magnetic bias generated in the magnetic core 11 of the transformer 10.

A magnetic flux density distributes inhomogeneously at a corner of the magnetic core of the transformer used for insulated power supplies and insulating converters, for example. The detector 20 uses this property to detect magnetic bias generated in the magnetic core.

According to the static magnetism, it is known that a magnetic flux line curvature is proportional to a spatial gradient of the magnetic flux density inside the medium (magnetic core) where the magnetic permeability is constant. For example, forming a magnetic path along a sharp corner or a sharply curved portion increases the magnetic flux line curvature inside to generate an excessively high magnetic flux density. At such a location, inhomogeneous distribution in magnetic flux density occurs in a cross section across the magnetic path (magnetic flux line). In the following description, the cross section of the magnetic core crossing the magnetic path and having inhomogeneous distribution in magnetic flux density is referred to as a non-uniform cross section.

Figure 4:
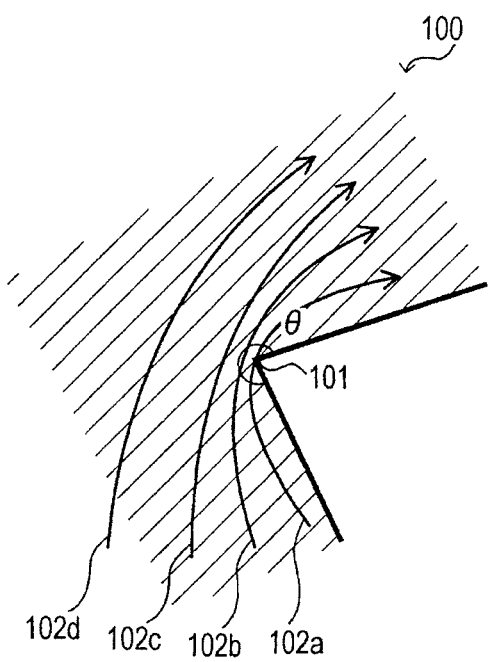
FIG. 4 is an explanatory diagram illustrating magnetic flux lines bent at a medium corner.

For example, FIG. 4 illustrates that magnetic flux lines 102a through 102d are formed at a corner 100 of degree $\theta$ in the medium. In this case, Maxwell's equation yields the following formula to express magnetic flux density Bin inside the medium near an edge 101 on the external surface inside the location.

$$B_{in} \propto r^{((\pi/\theta)-1)}$$

where length r denotes the distance from the edge 101, $\theta$ denotes the angle of edge 101, and Bin denotes the magnetic flux density.

The above-mentioned formula shows that magnetic flux density Bin diverges near the edge 101 if $\theta$ is greater than $\pi$. However, this phenomenon occurs if the medium ensures the constant magnetic permeability. On actual magnetic materials, the magnetic saturation progresses to decrease the magnetic permeability if the magnetic flux density excessively increases to exceed a saturated magnetic flux density. Thus, the magnetic flux density remains a finite value.

Figure 5:
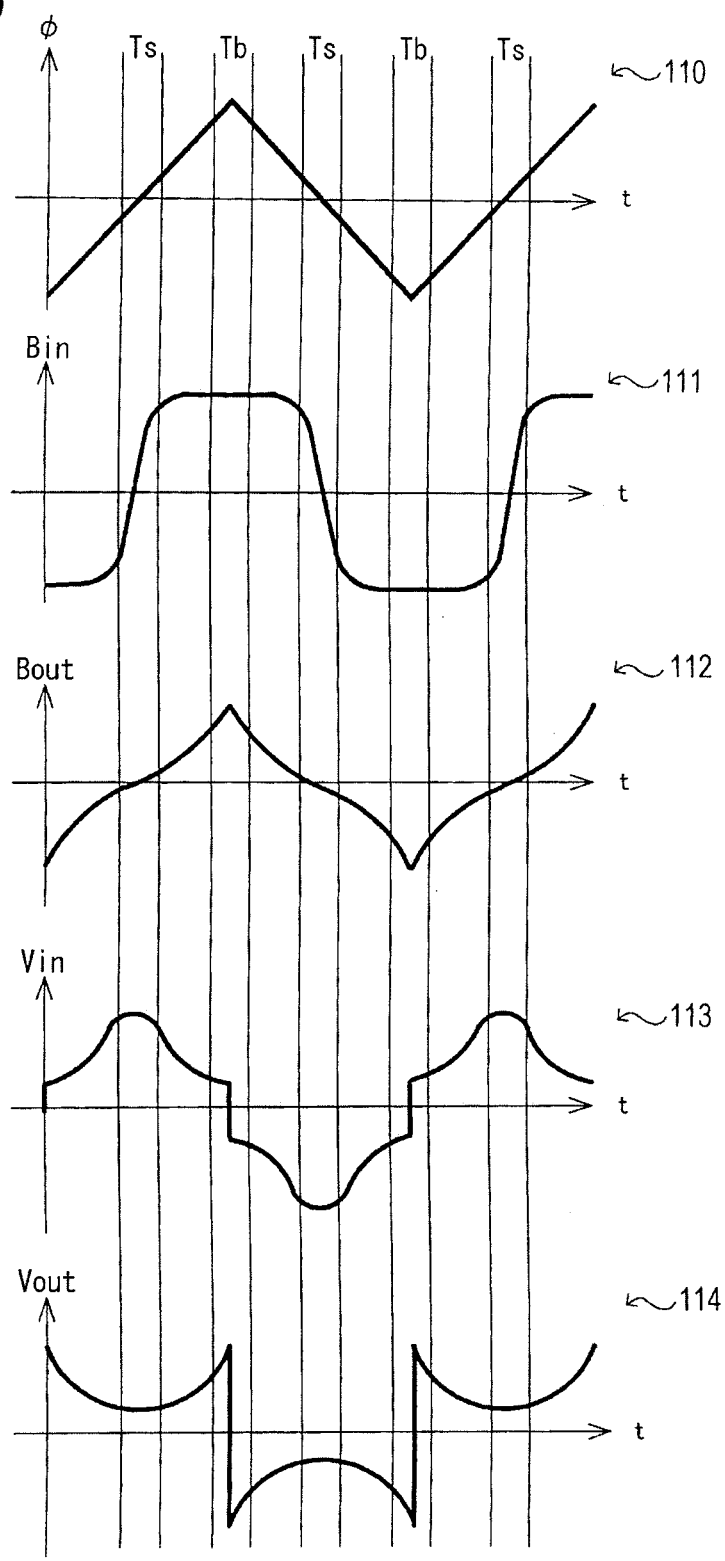
FIG. 5 is a graph showing magnetic flux densities at the corner of the medium changing with magnetic flux $\phi$ of the entire medium and induction voltages at a detection winding provided for the corner.

Graph 110 in FIG. 5 shows that magnetic flux $\phi$ for the entire magnetic path changes in a triangular waveform. Under this condition, the following examines magnetic flux density Bin near the edge 101 of the corner 100 and magnetic flux density Bout for a region inside the medium (also referred to as an outer region) positioned outside the vicinity of the edge 101. It should be noted that magnetic flux $\phi$ changes as far as an average magnetic flux density for the entire magnetic path cross section does not exceed the saturated magnetic flux density for a magnetic material used as the medium.

Period Ts in FIG. 5 shows a sufficiently small absolute value of magnetic flux $\phi$ for the entire magnetic path. In this case, no magnetic saturation occurs even if magnetic flux density Bin near the edge 101 remarkably increases to be higher than its circumference. The magnetic flux waveform remains linear near the edge 101. As shown by graph 111, period Ts causes a raised waveform for magnetic flux density Bin near the edge 101.

Period Tb shows a sufficiently large absolute value of magnetic flux $\phi$ for the entire magnetic path. The magnetic saturation strongly affects magnetic flux density Bin near the edge 101. The magnetic permeability for the medium decreases to increase a magnetic resistance to the magnetic flux passing near the edge 101 if magnetic flux density Bin exceeds the saturated magnetic flux density. This alleviates further concentration of the magnetic flux near the edge 101. As a result, period Tb in graph 111 suppresses the time derivative of magnetic flux density Bin near the edge 101.

The magnetic flux mainly passes near the edge 101 during period Ts to decrease the time derivative of the magnetic flux in the outside region. Subsequent period Tb suppresses the magnetic flux passing near the edge 101. The magnetic flux passing through the outside region increases to increase the time derivative of the magnetic flux. As a result, magnetic flux density Bout in the outside region changes as shown by graph 112.

In a case where a detection winding is provided around the vicinity of the edge 101 to be interlinked with the magnetic flux, a voltage Vin induced by the detection winding is proportional to the time derivative (degree of change per unit time) of magnetic flux density Bin, and the waveform results as shown by graph 113. In a case where a detection winding is provided around the outside region to be interlinked with the magnetic flux, the waveform for a voltage Vout induced by the detection winding results as shown by graph 114 for the same reason.

Measuring a voltage induced by the detection winding can determine whether the magnetic flux generated in the magnetic core is sufficiently small (period Ts) or sufficiently large (period Tb).

The following describes the relationship between the induction voltage from the detection winding and the magnetic flux density in order to specifically consider the magnetic bias detection method based on the above-mentioned knowledge. In the following description, $\lambda$ denotes the magnetic flux across a partial region of the non-uniform cross section surrounded by the detection winding, $\phi$ denotes the magnetic flux for the entire non-uniform cross section, and t denotes the time. Induction voltage Vd from the detection winding depends on the time derivative of magnetic flux λ. Magnetic flux φ uniquely determines magnetic flux λ. Thus, the induction voltage Vd can be expressed by the following equation. The equation ignores effects of the hysteresis or a leakage magnetic flux.

$$Vd=d\lambda/dt=(d\lambda/d\phi)*d\phi/dt=(d\lambda/d\phi)*Vcoil$$

where Vcoil denotes the voltage applied to the primary winding (or the secondary winding) of the medium (magnetic core) configured as a transformer, for example.

In the equation, $d\lambda/d\phi$ is a function that uses only magnetic flux φ as a variable. The value of magnetic flux φ can be calculated by finding the ratio between induction voltage Vd of the detection winding and voltage Vcoil applied to the primary winding. The absolute value of Vcoil can be assumed to be constant, for example, on an insulating converter that ensures the constant amplitude of a voltage applied to the primary winding. Then, the absolute value of induction voltage Vd of the detection winding reflects magnetic flux φ.

The following describes the relationship among the inner induction voltage Vin induced by the inner detection winding 21, the outer induction voltage Vout induced by the outer detection winding 22, and states of the magnetic bias in the magnetic core 11 of the insulated power supply 1 according to the first embodiment.

Figure 6:
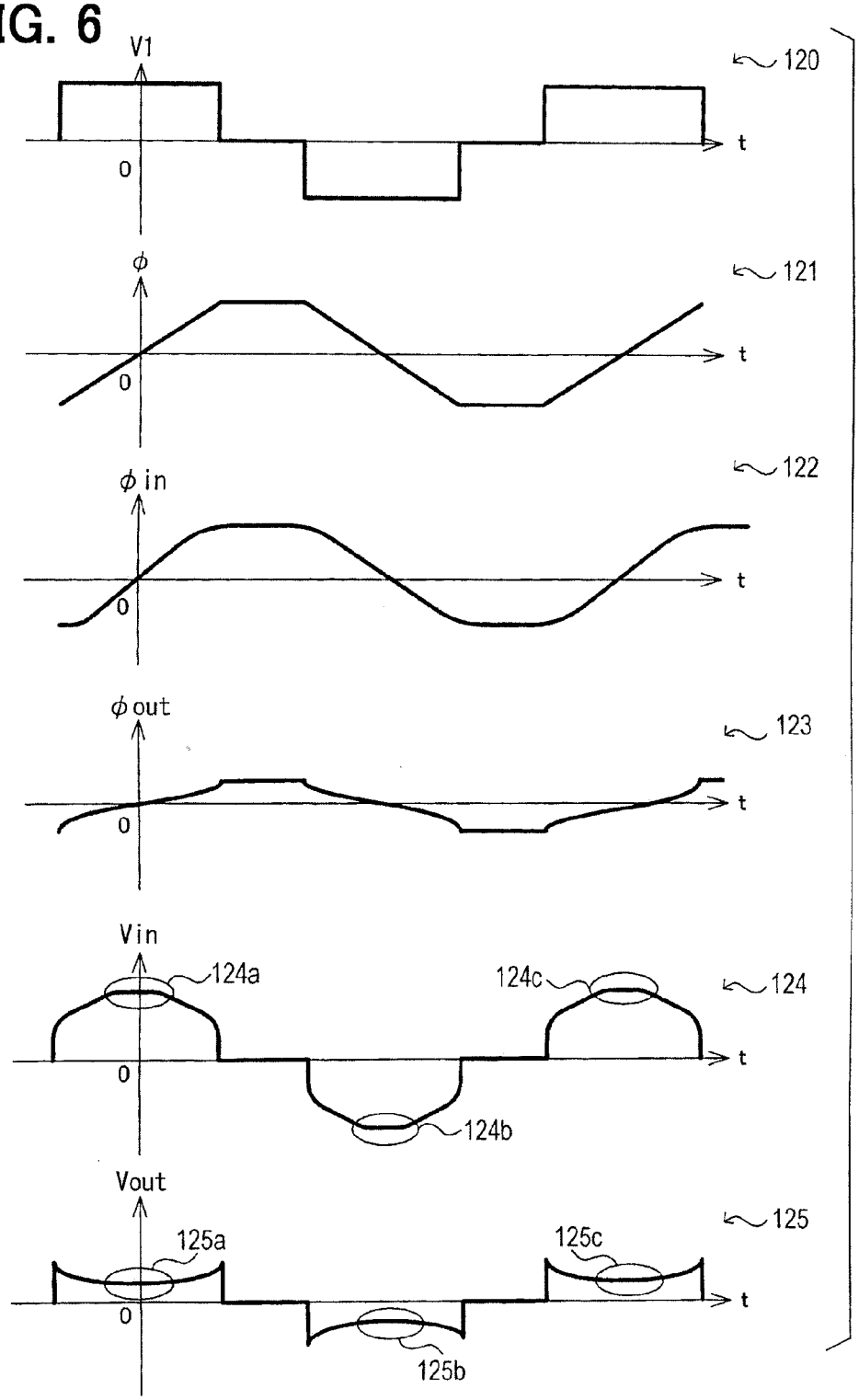
FIG. 6 is a graph showing changes in magnetic flux $\phi$ for the entire magnetic core of the transformer, the magnetic flux density of the magnetic core at the corner, and the induction voltage at the detection winding provided for the corner when a rectangular wave voltage is applied to a primary winding of the transformer.

In a case where no magnetic bias occurs, it is assumed that AC voltage V1 applied to the primary winding 12 of the magnetic core 11 changes in a rectangular wave as shown by graph 120 in FIG. 6. Magnetic flux φ corresponds to the non-uniform cross section 11d as an entire cross section of the magnetic core 11. Magnetic flux φin corresponds to the inner partial region 11dx surrounded by the Inner detection winding 21. Magnetic flux φout corresponds to the outer partial region 11dy surrounded by the outer detection winding 22. Magnetic fluxes φ, φin, and φout change as shown by graphs 121 through 123. The induction voltages Vin and Vout change as shown by graphs 124 and 125. The induction voltage waveforms are bilaterally symmetric during periods that apply non-zero voltage V1 to the primary winding 12.

The absolute value of the inner induction voltage Vin is greater than the absolute value of the outer induction voltage Vout. Graphs 124 and 125 use different scales for Vin and Vout. A voltage application period includes maximum periods 124a through 124c In which the absolute value of the inner induction voltage Vin approximates the maximum. The voltage application period further Includes minimum periods 125a through 125c in which the absolute value of the outer induction voltage Vout approximates the minimum.

Figure 7:
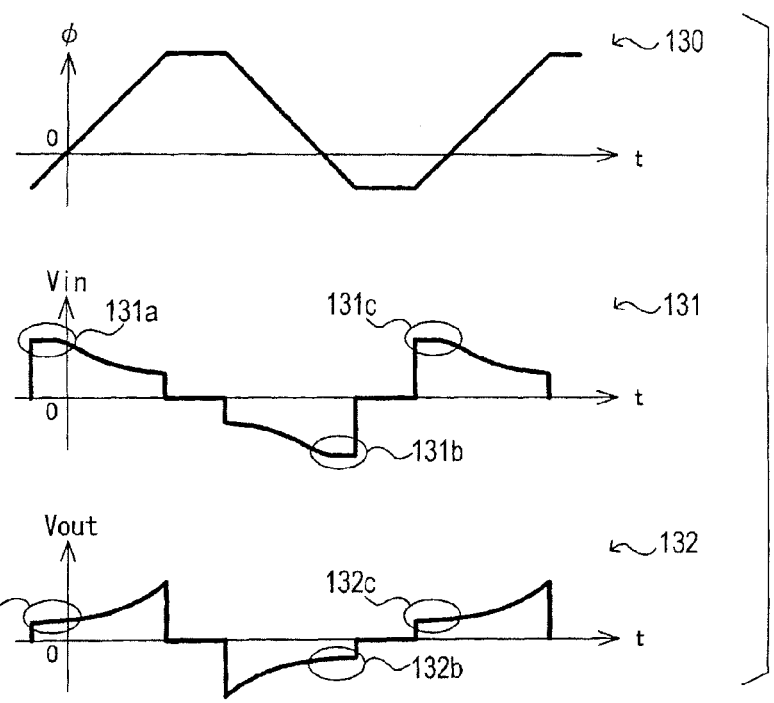
FIG. 7 is a graph showing the magnetic flux density at the magnetic core corner changing with magnetic flux $\phi$ of the entire magnetic core and the induction voltage at the detection winding provided for the corner when a positive magnetic bias occurs in the transformer core.

Graphs 130 through 132 in FIG. 7 show that a magnetic bias occurs and magnetic flux φ for the entire cross section is deflected in the positive direction. In this case, the voltage application period loses the symmetry of the waveforms for the induction voltages Vin and Vout. The positive inner induction voltage Vin causes maximum periods 131a and 131c to occur earlier. The negative inner induction voltage Vin causes maximum period 131b to occur later. The positive outer induction voltage Vout causes minimum periods 132a and 132c to occur earlier. The negative outer induction voltage Vout causes minimum period 132b to occur later.

Figure 8:
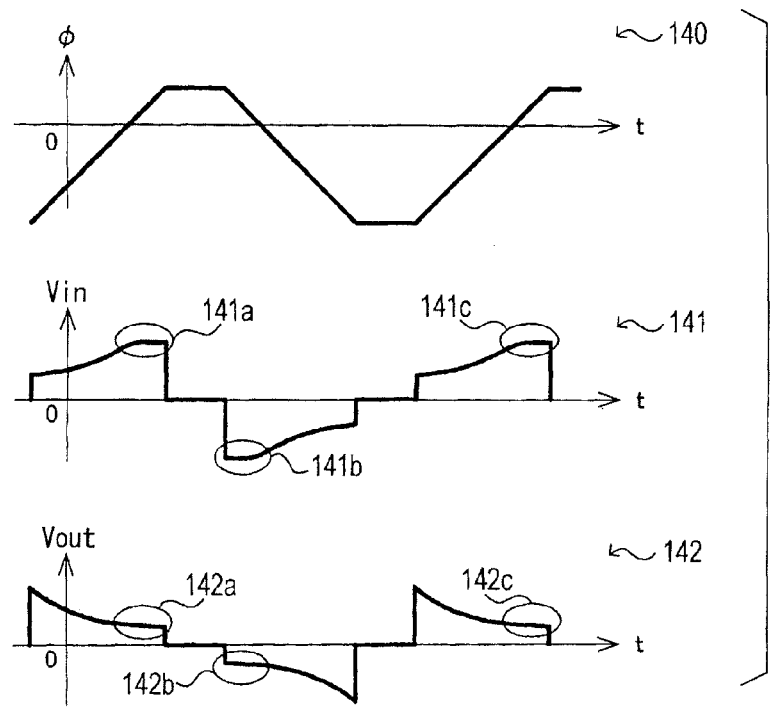
FIG. 8 is a graph showing the magnetic flux density at the magnetic core corner changing with magnetic flux $\phi$ of the entire magnetic core and the induction voltage at the detection winding provided for the corner when a negative magnetic bias occurs in the transformer core.

Similarly, graphs 140 through 142 in FIG. 8 show that a magnetic bias occurs and magnetic flux φ for the entire cross section is deflected in the negative direction. Also in this case, the voltage application period loses the symmetry of the waveforms for the induction voltages Vin and Vout. The positive inner Induction voltage Vin causes maximum periods 141a and 141c to occur later. The negative inner induction voltage Vin causes maximum period 141b to occur earlier. The positive outer induction voltage Vout causes minimum periods 142a and 142c to occur later. The negative outer induction voltage Vout causes minimum period 142b to occur earlier.

The detector 20 detects a magnetic bias generated in the magnetic core 11 based on induction voltage distortions in the voltage application period. If a magnetic bias occurs, the direction to deflect the maximum or minimum period of each induction voltage depends on the polarity of magnetic coupling among the primary winding 12, and the inner and outer detection windings 21 and 22. The direction to deflect the maximum or minimum period depends on the direction to cause a magnetic bias. Detecting the direction can determine the polarity of the magnetic bias.

The following description assumes that applying a positive voltage to the primary winding 12 allows the magnetic core 11 to cause a magnetic flux in the positive direction and applying a negative voltage to the same allows the magnetic core 11 to cause a magnetic flux in the negative direction. The following description also assumes that change in the voltage applied to the primary winding 12 also change magnetic fluxes φ, φin, and φout, and the inner and outer induction voltages Vin and Vout generated in the magnetic core 11 according to the above-mentioned patterns.

However, the present disclosure is not limited thereto. Obviously, the polarity of magnetic coupling among the primary winding 12, and the inner and outer detection windings 21 and 22 changes the direction of a magnetic flux generated in the magnetic core 11 and the polarity of each induction voltage.

[Details of the Magnetic Bias Detection Method]

The following describes in details how the detector detects a magnetic bias in the magnetic core 11 of the transformer 10 in the detector 20.

<First Determination Process>

A first determination process detects a magnetic bias in the magnetic core 11 by comparing inner or outer induction voltages with a threshold value at specified timings during the period to apply a voltage to the primary winding 12.

Figure 9:
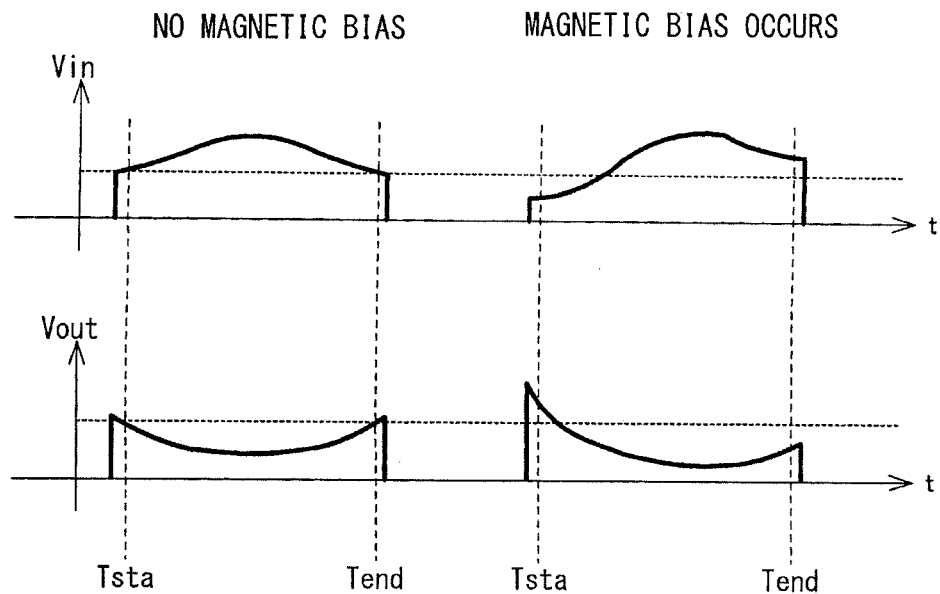
FIG. 9 is an explanatory diagram illustrating changes in induction voltages Vin and Vout at inner and outer detection windings provided for the corner of the transformer core depending on whether a magnetic bias occurs or not.

As an example, FIG. 9 shows timing Tend immediately before the end of the period to apply a positive voltage to the primary winding 12. At timing Tend, a magnetic bias generated in the magnetic core 11 toward the negative direction increases the inner induction voltage Vin and decreases the outer induction voltage Vout compared to the normal state that causes no magnetic bias. At timing Tend, by contrast, a magnetic bias generated in the magnetic core 11 toward the positive direction decreases the inner induction voltage Vin and Increases the outer induction voltage Vout compared to the normal state.

Threshold values Vth1 and Vth2 are set based on the inner induction voltage Vin to be measured at timing Tend in the normal state. The controller 23 determines that a negative magnetic bias occurs in the magnetic core 11 if the inner induction voltage Vin is greater than threshold value Vth1 at timing Tend. The controller 23 determines that a positive magnetic bias occurs in the magnetic core 11 if the inner induction voltage Vin is smaller than threshold value Vth2 at timing Tend.

Similarly, threshold values Vth3 and Vth4 are set based on the outer induction voltage Vout to be measured at timing Tend in the normal state. The controller 23 determines that a negative magnetic bias occurs in the magnetic core 11 if the outer induction voltage Vout is smaller than threshold value Vth3 at timing Tend. The controller 23 determines that a positive magnetic bias occurs in the magnetic core 11 if the outer induction voltage Vout is greater than threshold value Vth4 at timing Tend.

As another example, FIG. 9 shows timing Tsta immediately after the beginning of the period to apply a positive voltage to the primary winding 12. At timing Tsta, a magnetic bias generated in the magnetic core 11 toward the negative direction decreases the inner induction voltage Vin and increases the outer induction voltage Vout compared to the normal state. At timing Tsta, a magnetic bias generated in the magnetic core 11 toward the positive direction increases the inner induction voltage Vin and decreases the outer induction voltage Vout compared to the normal state.

Threshold values may be set based on the inner induction voltage Vin and the outer induction voltage Vout at timing Tsta in the normal state. The inner and outer induction voltages Vin and Vout may be compared with the threshold values at timing Tsta to detect a magnetic bias, if any, and the direction of the magnetic bias.

Any timings may be used other than Tsta and Tend. A method similar to the above-mentioned may be used to detect a magnetic bias, if any, and the direction of the magnetic bias at a given timing after the lapse of a specified period from the beginning of applying a positive or negative voltage to the primary winding 12.

Figure 10:
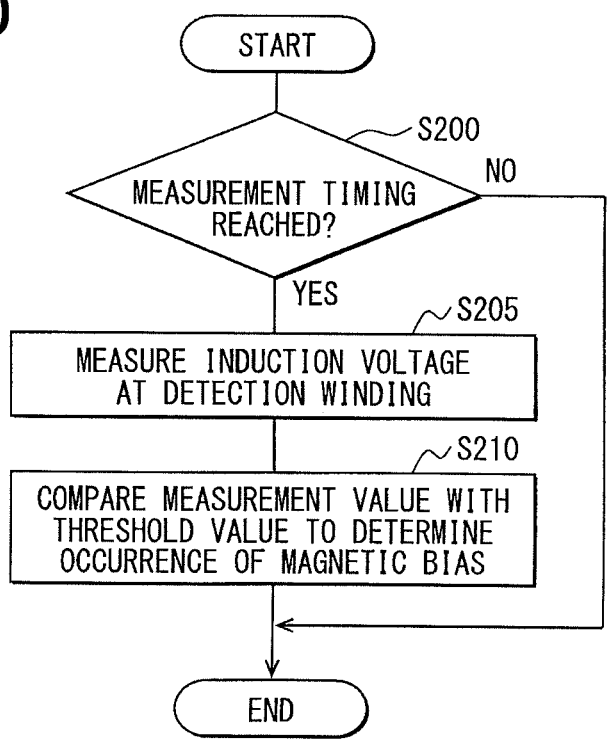
FIG. 10 is a flowchart showing a first determination process according to the first embodiment.

The first determination process will be described with reference to a flowchart in FIG. 10. The controller 23 of the detector 20 periodically performs the first determination process. At S200, the controller 23 of the detector 20 is supplied with a voltage signal from the inverter circuit 40 and determines, based on the voltage signal, whether the process reaches the measurement timing to perform the above-mentioned comparison. If the determination is affirmed (Yes at S200), the controller 23 passes control to S205. If the determination is negated (No at S200), the controller 23 terminates the process.

At S205, the controller 23 measures an inner or outer induction voltage. The controller 23 compares the measurement result with the threshold value and determines, based on the comparison result, whether a magnetic bias occurs in the magnetic core 11. When determining that a magnetic bias occurs, the controller 23 detects the direction of the magnetic bias (magnetic bias direction) based on the polarity of a voltage applied to the primary winding 12 or the polarity of the induction voltage (S210). The controller 23 then terminates the process.

By performing the first determination process, the controller 23 can reliably detect a magnetic bias in the magnetic core 11 and the magnetic bias direction. A voltage changing as a sine wave or a triangle wave may be applied to the primary winding 12. In such a case, a threshold value may be set similarly based on an inner or outer induction voltage at a predetermined measurement timing in the normal state. The controller 23 may detect a magnetic bias and the magnetic bias direction by measuring an inner or outer induction voltage at the measurement timing and comparing a measurement value with the threshold value.

The threshold value is affected by the amplitude of an AC voltage applied to the primary winding 12 from the inverter circuit 40. If the amplitude is fixed, the threshold value may be predetermined and stored in the ROM of the controller 23.

If the amplitude is variable, the controller 23 may calculate the amplitude based on the voltage signal from the inverter circuit 40 at S205 of the first determination process. The controller 23 may set the threshold value based on the calculation result. At S210, the controller 23 may detect a magnetic bias by comparing the threshold value with a measurement value of the inner or outer induction voltage.

Alternatively, the controller 23 may calculate the amplitude based on the voltage signal at S205. At S210, the controller 23 may detect a magnetic bias by dividing the measurement value of the inner or outer induction voltage by the amplitude (to normalize the measurement value) and comparing the normalized measurement value with a predetermined threshold value.

The magnetic bias can be detected appropriately as described above. The primary winding 12 may leak much magnetic flux that does not pass through the magnetic core 11. In such a case, time derivative dϕ/dt of the entire magnetic flux amount ϕ passing through the magnetic core 11 does not fully reflect a voltage applied to the primary winding 12. As a result, a magnetic bias may not be detected properly even if a threshold value is calculated based on the amplitude of an AC voltage applied to the primary winding 12 or the amplitude is used to normalize the measurement value for an inner or outer induction voltage.

If the insulated power supply 1 is provided with the reference winding 50 (see FIG. 3), an induction voltage from the reference winding 50 reflects time derivative dϕ/dt of the entire magnetic flux amount ϕ passing through the magnetic core 11 even if the primary winding 12 generates much leakage magnetic flux. The above-mentioned threshold value is set based on an inner or outer induction voltage in the normal state and on the reference induction voltage induced by the reference winding 50.

If the amplitude is variable, the controller 23 may further measure the reference induction voltage at S205 of the first determination process and set the threshold value based on the measurement result. At S210, the controller 23 may detect a magnetic bias by comparing the threshold value with the measurement value for the inner or outer induction voltage.

Alternatively, the controller 23 may further measure the reference induction voltage at S205. At S210, the controller 23 may normalize a measurement value for the inner or outer induction voltage using the reference induction voltage and compare the normalized measurement value with the predetermined threshold value to detect a magnetic bias.

The magnetic bias can be detected appropriately as described above even if much magnetic flux leaks. The configuration of the insulated power supply 1 can be simplified because the inverter circuit 40 needs not supply a voltage signal to the detector 20.

<Second Determination Process>

A second determination process detects a magnetic bias in the magnetic core 11 by comparing two inner induction voltages (or two outer induction voltages) measured immediately after the beginning of the period to apply voltage to the primary winding 12 and immediately before the end of the period to apply voltage to the primary winding 12.

As described above, the inner and outer induction voltages indicate symmetric waveforms during the voltage application period in the normal state. Values of the induction voltages are equal to each other at timing Tsta immediately after the beginning of the voltage application period and at timing Tend immediately before the end of the voltage application period (see FIG. 9).

However, the symmetry is lost if a magnetic bias occurs in the magnetic core 11. The induction voltages differ from each other at timings Tsta and Tend. In such a case, the controller 23 measures the inner induction voltage or the outer Induction voltage at the timings. If a difference between the measurement results exceeds a specified value, the controller 23 determines that a magnetic bias occurs in the magnetic core 11.

The controller 23 may use the magnitude relationship between the results of measuring the induction voltages at the timings to determine whether the magnetic bias occurs in the positive or negative direction. In a case where the inner induction voltage is to be measured, a negative magnetic bias occurs in the magnetic core 11 if the measurement value at timing Tsta is smaller than the measurement value at timing Tend. By contrast, a positive magnetic bias occurs in the magnetic core 11 if the measurement value at timing Tsta is larger than the measurement value at timing Tend.

Figure 11:
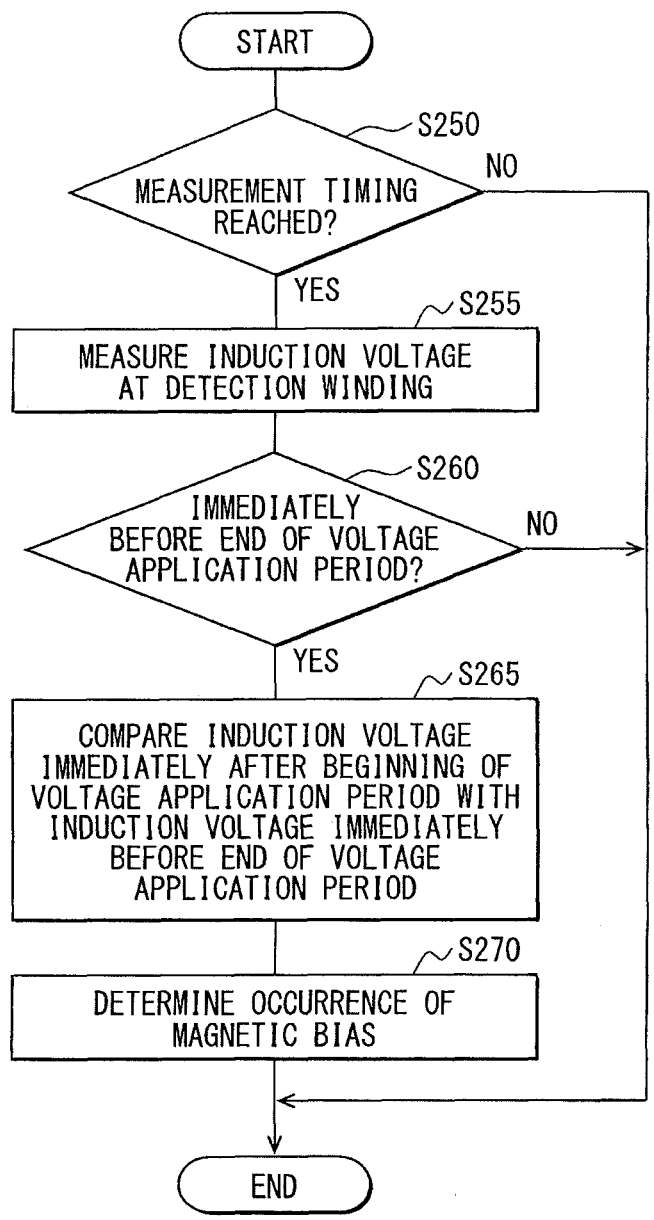
FIG. 11 is a flowchart showing a second determination process according to the first embodiment.

The second determination process will be described with reference to a flowchart in FIG. 11. The controller 23 of the detector 20 periodically performs the second determination process. At S250, the controller 23 of the detector 20 is supplied with a voltage signal from the inverter circuit 40 and determines, based on the voltage signal, whether the process reaches timing Tsta immediately after the beginning of the voltage application period or timing Tend immediately before the end of the voltage application period. If the determination is affirmed (Yes at S250), the controller 23 passes control to S255. If the determination is negated (No at S250), the controller 23 terminates the process.

If the reference winding 50 is provided, the controller 23 may determine the reach to timing Tsta and Tend based on the time elapsed from the rise of the reference induction voltage induced by the reference winding 50.

At S255, the controller 23 measures the inner induction voltage or the outer induction voltage and determines whether the measurement reaches timing Tend (S260). If the determination is affirmed (Yes at S260), the controller 23 passes control to S265. If the determination is negated (No at S260), the controller 23 terminates the process.

At S265, the controller 23 compares the results of measuring the inner Induction voltage or the outer induction voltage at the most recent timings Tsta and Tend. At S270, the controller 23 determines, based on the comparison result, whether a magnetic bias occurs in the magnetic core 11. When determining that a magnetic bias occurs, the controller 23 detects the magnetic bias direction based on the magnitude relationship between the measurement results at the timings and the induction voltage to be measured. The controller 23 then terminates the process.

The above-mentioned determination method can eliminate the threshold value as used for the first determination process and detect a magnetic bias more easily. The method can easily detect a magnetic bias even if the amplitude of an AC voltage applied to the primary winding 12 is variable.

<Third Determination Process>

A third determination process detects a magnetic bias in the magnetic core 11 based on temporal differences in the result of comparison between the inner induction voltage and the outer induction voltage.

As described above, the inner and outer induction voltages indicate symmetric waveforms during the voltage application period in the normal state. The inner induction voltage indicates small absolute values at the beginning and the end of the voltage application period and a large absolute value in the middle. By contrast, the outer induction voltage indicates large absolute values at the beginning and the end of the voltage application period and a small absolute value in the middle.

Figure 12:
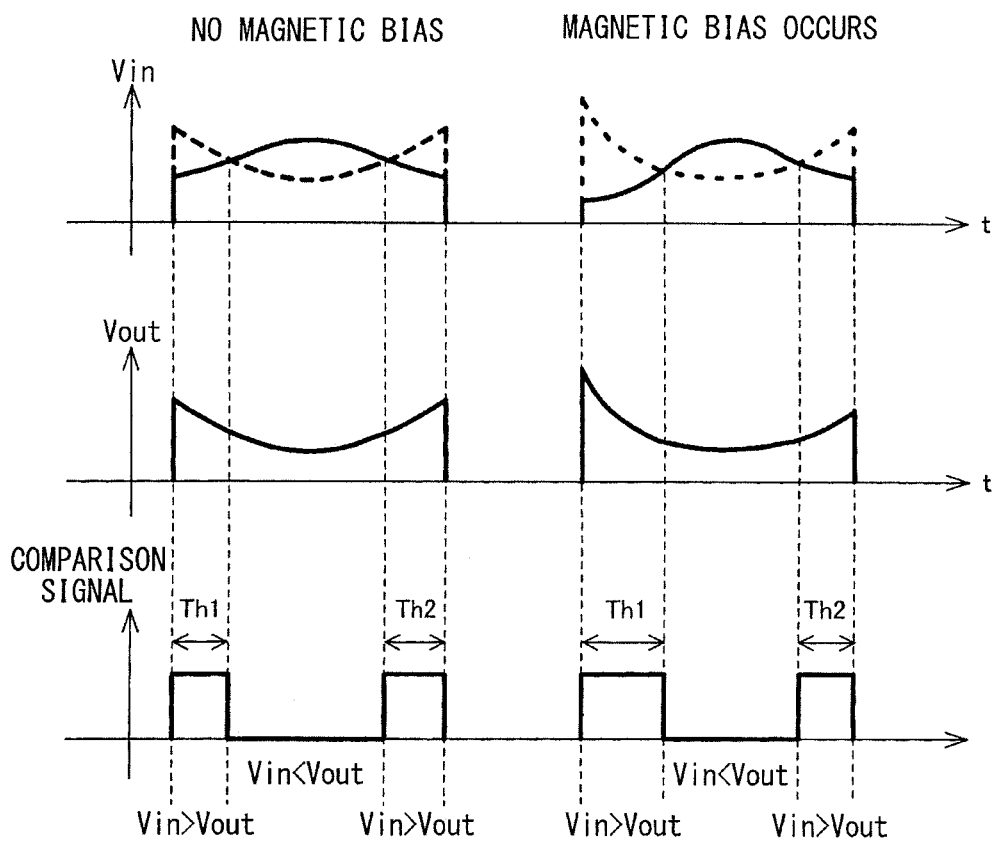
FIG. 12 is an explanatory diagram showing comparison signals output from a comparison circuit that compares induction voltages Vin and Vout depending on whether a magnetic bias occurs or not.

A comparison circuit is used to compare the outer induction voltage Vout with the inner induction voltage Vin while adjusting these induction voltages to appropriate levels. FIG. 12 illustrates determination periods Th1 and Th2 during which the outer induction voltage Vout is larger than the inner induction voltage Vin. In the normal state, determination period Th1 appears for a specified length from the beginning of the positive voltage application period. Similarly, determination period Th2 appears for a specified length up to the end of the positive voltage application period. The determination periods have the same length.

By contrast, the waveforms for the inner and outer induction voltages Vin and Vout lose the symmetry during the voltage application period if a magnetic bias occurs in the magnetic core 11. During the positive voltage application period, a positive magnetic bias causes determination period Th2 to be longer than determination period Th1. A negative magnetic bias causes determination period Th1 to be longer than determination period Th2. The third determination process detects a magnetic bias by comparing lengths of the determination periods. The third determination process also detects the magnetic bias direction based on which determination period is longer.

Figure 13:
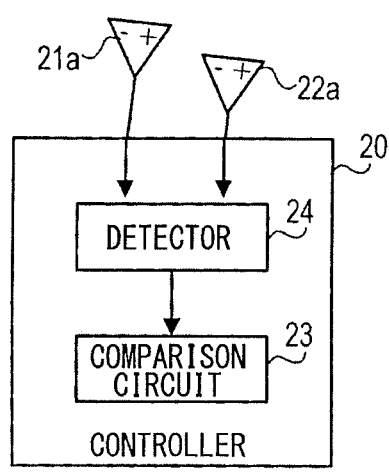
FIG. 13 is a block diagram illustrating a detector to perform a third determination process according to the first embodiment.

The detector 20 to perform the third determination process further includes a comparison circuit 24 that is supplied with inner and outer induction voltages via the amplifier circuits 21*a* and 22*a* (see FIG. 13). The comparison circuit 24 compares these induction voltages and supplies the controller 23 with a comparison signal that indicates a comparison result.

The negative voltage application period reverses the polarities of induction voltages during the positive voltage application period. In this case, determination periods Th1 and Th2 cause the outer induction voltage Vout to be lower than the inner induction voltage Vin. Determination periods Th1 and Th2 appear for a specified length from the beginning of the negative voltage application period and for a specified length up to the end of the negative voltage application period. The third determination process can similarly detect a magnetic bias by comparing lengths of the determination periods.

Generally, the absolute value of the outer induction voltage Vout is smaller than the absolute value of the inner induction voltage Vin, though depending on the number of times each detection winding is wound around the partial region. For this reason, the amplifier circuits 21*a* and 22*a* corresponding to the detection windings are adjusted to allow a gain of the outer induction voltage Vout to be higher than a gain of the inner induction voltage Vin. Under this condition, the induction voltages are input to the comparison circuit 24. Obviously, the amplifier circuit 21*a* may be replaced by an attenuation circuit corresponding to the inner detection winding 21 to adjust induction voltage levels by attenuating the inner Induction voltage Vin.

Figure 14:
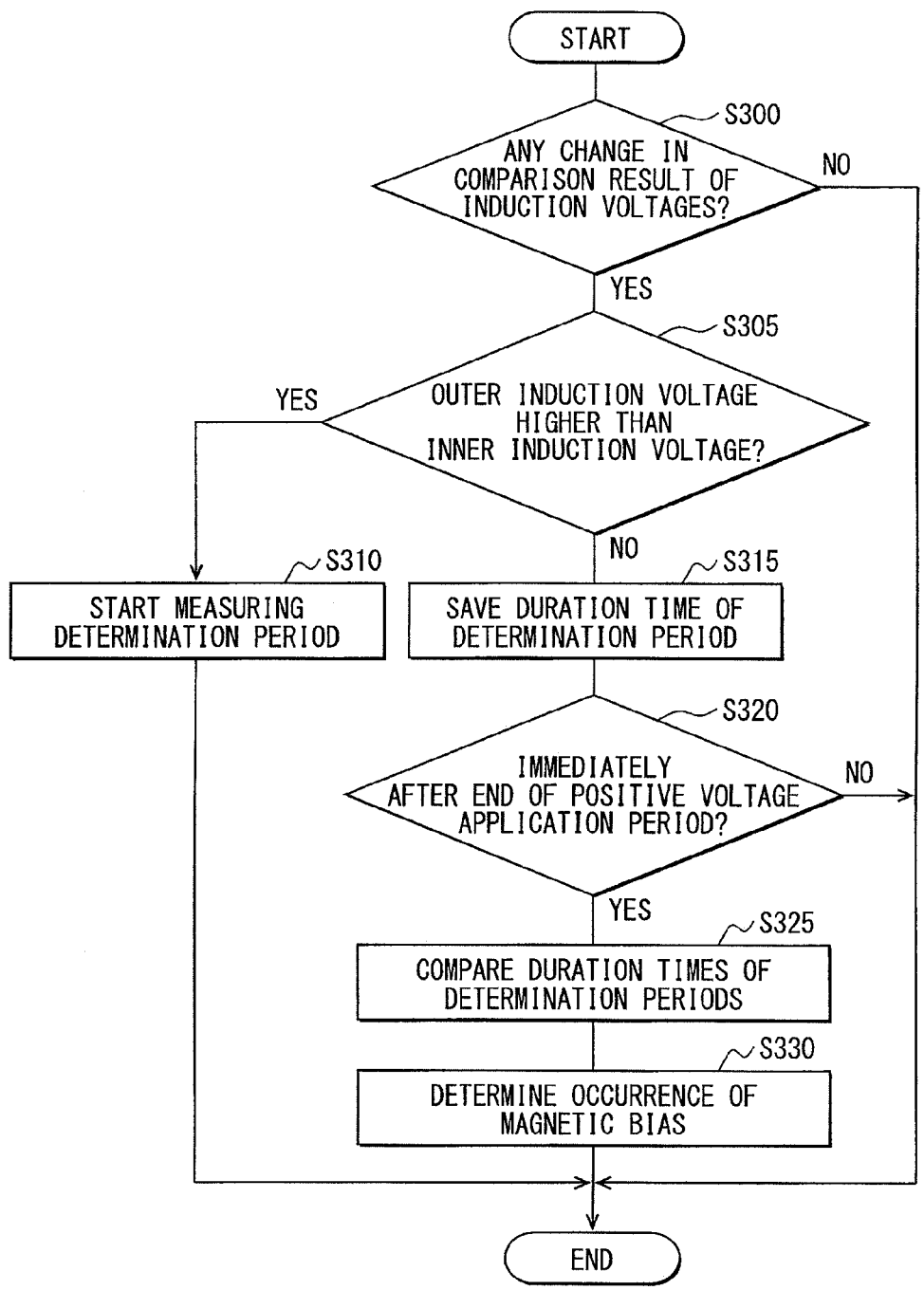
FIG. 14 is a flowchart showing the third determination process according to the first embodiment.

The third determination process will be described with reference to a flowchart in FIG. 14. The controller 23 of the detector 20 periodically performs the third determination process. At S300, the controller 23 of the detector 20 determines, based on the comparison signal from the comparison circuit 24, whether there is a change in the result of comparing the inner and outer induction voltages. If the determination is affirmed (Yes at S300), the controller 23 passes control to S305. If the determination is negated (No at S300), the controller 23 terminates the process.

At S305, the controller 23 determines, based on the comparison signal, whether the outer induction voltage is higher than the inner induction voltage. If the determination is affirmed (Yes at S305), the controller 23 passes control to S310. If the determination is negated (No at S305), the controller 23 passes control to S315.

At S310, the controller 23 starts measuring the duration time of a determination period during which the absolute value of the outer induction voltage is greater than the absolute value of the inner induction voltage. The controller 23 then terminates the process. At S315, the controller 23 stops measuring the duration time of the determination period, saves the duration time, and advances the process to S320.

At S320, the controller 23 determines, based on the voltage signal from the inverter circuit 40, whether the timing occurs immediately after the end of the positive voltage application period. This determination may be performed based on the reference induction voltage if the above-mentioned reference winding 50 is provided for the magnetic core 11 of the transformer 10. If the determination is affirmed (Yes at S320), the controller 23 passes control to S325. If the determination is negated (No at S320), the controller 23 terminates the process.

At S325, the controller 23 compares duration times of the most recently measured determination period (determination period Th2 immediately before the end of the voltage application period) and the previous determination period (determination period Th1 immediately after the beginning of the voltage application period). If a difference between the duration times is greater than or equal to a specified value, the controller 23 determines that a magnetic bias occurs. In addition, the controller 23 detects the magnetic bias direction based on which determination period is longer (S330). The controller 23 then terminates the process.

Alternatively, the controller 23 may measure inner and outer induction voltages using AD converters, compare measurement results, and perform the third determination process based on the comparison result instead of the comparison signal.

The above-mentioned determination method can detect a magnetic bias based on changes in the outer induction voltage and the inner induction voltage and therefore improve the sensitivity to detect a magnetic bias. If the comparison circuit 24 compares induction voltages, the controller 23 can detect a magnetic bias without using an AD converter, and it is possible to save hardware resources for the controller 23.

The method can eliminate the threshold value as used for the first determination process and detect a magnetic bias more easily. The method can easily detect a magnetic bias even if the amplitude of an AC voltage applied to the primary winding 12 is variable.

<Fourth Determination Process>

A fourth determination process detects a magnetic bias in the magnetic core 11 based on results of integrating an inner induction voltage or an outer induction voltage.

As described above, the inner and outer induction voltages Vin and Vout indicate symmetric waveforms during the voltage application period in the normal state. However, the symmetry is lost if a magnetic bias occurs in the magnetic core 11.

To solve this problem, the period to apply voltage to the primary winding 12 is bisected into a first half period and a second half period. The first half period is set to a non-inverting period during which the induction voltage polarity is not inverted. The second half period is set to an inverting period during which the induction voltage polarity is inverted. During the non-inverting period, an integrating circuit is supplied with a signal generated from an induction voltage whose polarity is not inverted. During the inverting period, the integrating circuit is not supplied with that signal but is supplied with a signal generated from an induction voltage whose polarity is inverted.

Figure 15:
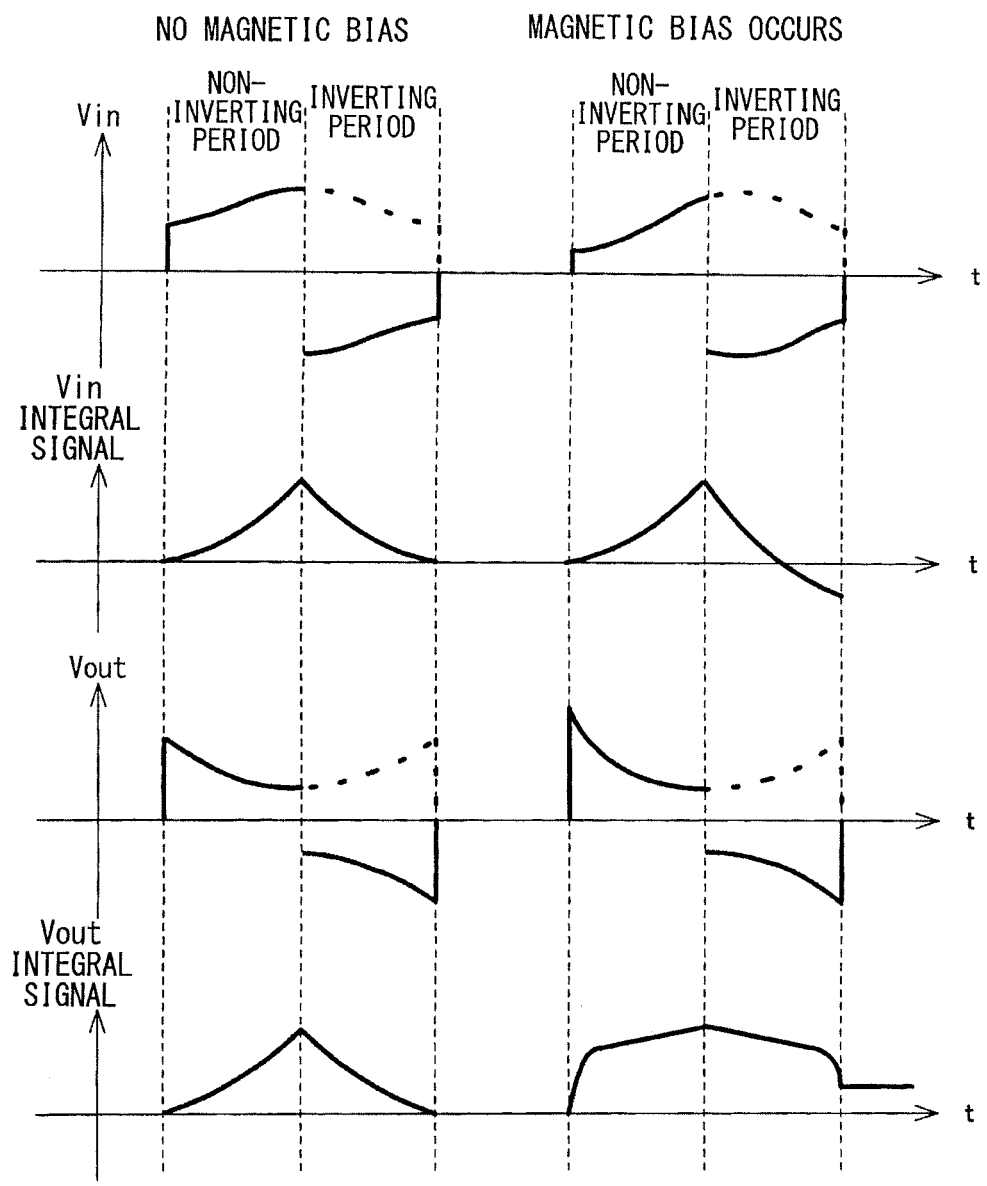
FIG. 15 is an explanatory diagram illustrating integral signals based on Induction voltages Vin and Vout at inner and outer detection windings provided for the corner of the transformer core depending on whether a magnetic bias occurs or not.

In the normal state, the integrating circuit generates an integral signal set to 0 V at the end of the voltage application period. If a magnetic bias occurs, the integral signal is not set to 0 V. For example, in a case where the integrating circuit is supplied with an inner induction voltage, if a positive magnetic bias occurs, the integral signal indicates a positive value at the end of the voltage application period. If a negative magnetic bias occurs, the integral signal indicates a negative value at the end of the voltage application period (see FIG. 15).

Figure 16:
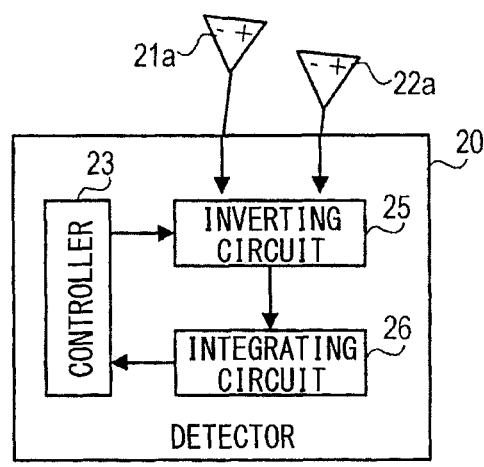
FIG. 16 is a block diagram illustrating a detector to perform a fourth determination process according to the first embodiment.

Using this property, the fourth determination process detects a magnetic bias in the magnetic core 11 and the magnetic bias direction. As illustrated in FIG. 16, the detector 20 to perform fourth determination process further includes an inverting circuit 25 using an operational amplifier and an integrating circuit 26.

The inverting circuit 25 is supplied with an inner induction voltage or an outer induction voltage via the amplifier circuits 21a and 22a. The inverting circuit 25 inverts the polarity of the induction voltage according to an instruction from the controller 23. The integrating circuit 26 is supplied with an inner induction voltage (or an outer induction voltage) or an inner induction voltage (or an outer induction voltage) that is inverted by the inverting circuit 25. The integrating circuit 26 integrates a signal generated from the supplied induction voltage.

Figure 17:
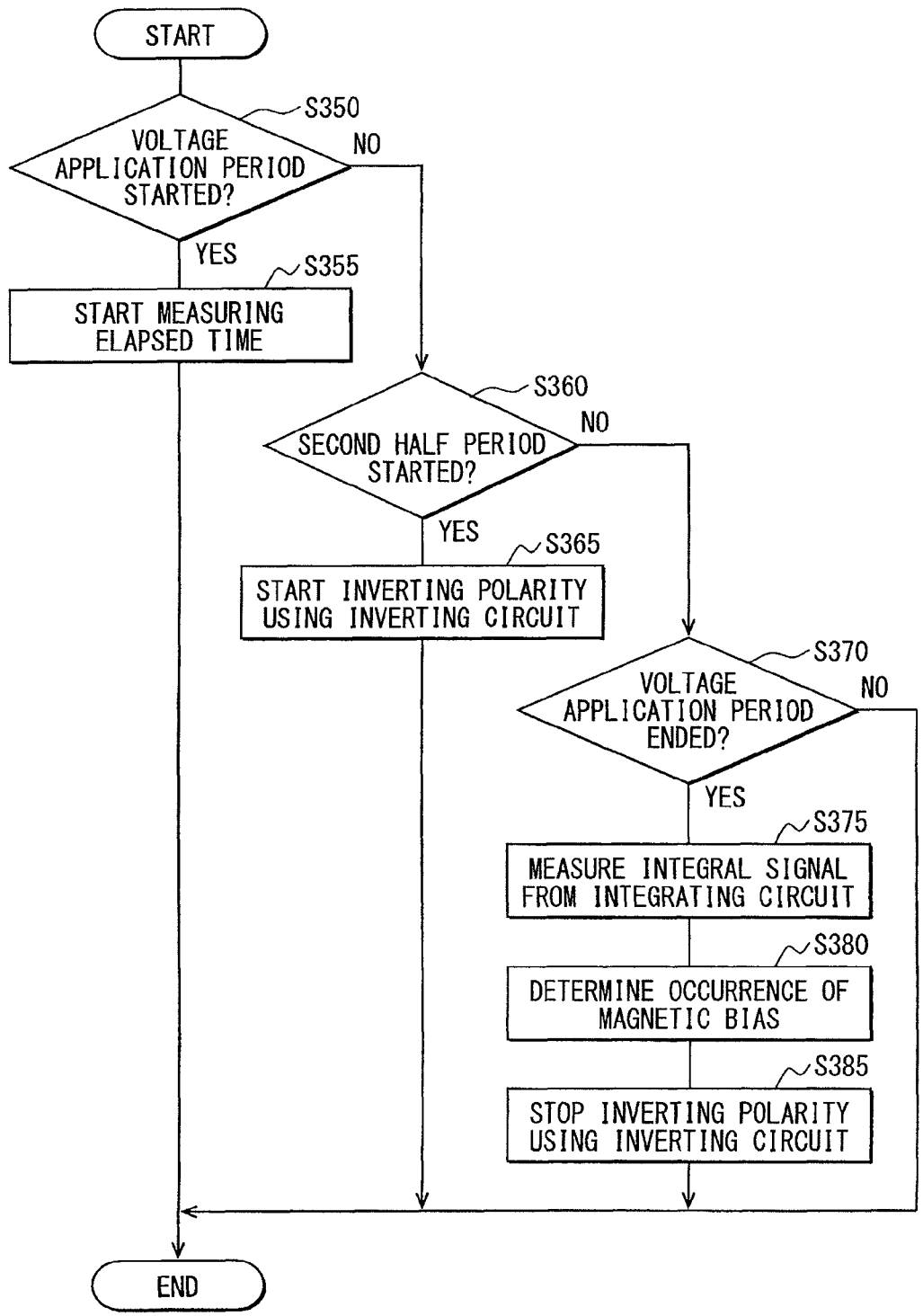
FIG. 17 is a flowchart showing the fourth determination process according to the first embodiment.

The fourth determination process will be described with reference to a flowchart in FIG. 17. The controller 23 of the detector 20 periodically performs the fourth determination process. At S350, the controller 23 of the detector 20 determines, based on a voltage signal supplied from the inverter circuit 40, whether the voltage application period starts. Obviously, the controller 23 may perform the determination based on the reference induction voltage if the above-mentioned reference winding 50 is provided for the magnetic core 11 of the transformer 10. If the determination is affirmed (Yes at S350), the controller 23 passes control to S355. If the determination is negated (No at S350), the controller 23 passes control to S360.

At S355, the controller 23 starts measuring the elapsed time after the beginning of the voltage application period and then terminates the process. At S360, the controller 23 determines, based on the elapsed time, whether the second half period of the voltage application period starts. If the determination is affirmed (Yes at S360), the controller 23 passes control to S365. If the determination is negated (No at S360), the controller 23 passes control to S370.

At S365, the controller 23 configures the inverting circuit 25 to invert the polarity of the inner induction voltage or the outer induction voltage and then terminates the process. At S370, the controller 23 determines, based on a voltage signal from the inverter circuit 40 (or the reference induction voltage induced by the reference winding 50), whether the voltage application period ends. If the determination is affirmed (Yes at S370), the controller 23 passes control to S375. If the determination is negated (No at S370), the controller 23 terminates the process.

At S375, the controller 23 measures an integral signal generated from the Integrating circuit 26. The controller 23 determines that a magnetic bias occurs if the measurement value does not approximate 0. The controller 23 also detects the magnetic bias direction according to the measurement value polarity (S380).

At S385, the controller 23 configures the inverting circuit 25 not to invert the inner induction voltage polarity and then terminates the process. The determination method uses a result of integrating inner induction voltages. The determination method can detect a magnetic bias generated in the magnetic core 11 while suppressing the effect of a noise that may be generated from the inverter circuit 40 and may be superimposed on the inner induction voltage.

The controller 23 can detect a magnetic bias without using an AD converter. It is possible to save hardware resources for the controller 23. The method can eliminate the threshold value as used for the first determination process and detect a magnetic bias more easily. The method can easily detect a magnetic bias even if the amplitude of an AC voltage applied to the primary winding 12 is variable.

The detector 20 may perform fourth determination process as described below without using the inverting circuit 25 or the integrating circuit 26. Inner and outer induction voltages are input to the controller 23 of the detector 20 via the amplifier circuits 21*a* and 22*a*. The controller 23 periodically samples the inner and outer induction voltages. The controller 23 calculates an integrated value based on voltage values during the polarity non-inverting period. The controller 23 calculates an integrated value based on inverted voltage values during the polarity inverting period. The controller 23 adds integrated values during these periods. If the addition value approximates 0, the controller 23 determines that no magnetic bias occurs in the magnetic core 11. Otherwise, the controller 23 determines that a magnetic bias occurs.

The same effect is available even in this case.

Much magnetic flux may leak from the primary winding 12 without passing through the magnetic core 11. If a specified voltage is applied to the primary winding in such a case, the inner and outer voltage may indicate different time derivatives dϕ/dt of the entire magnetic flux amount ϕ passing through the magnetic core 11 at the beginning and the end of the voltage application period.

To restrict the incorrect determination, an induction voltage may be acquired by dividing an inner or outer induction voltage by the reference voltage and may replace the inner or outer induction voltage.

The inner or outer induction voltage may lose the symmetry during the voltage application period because a voltage applied to the primary winding is not assumed constant. To solve this problem, the induction voltages may be similarly replaced by the induction voltage that is normalized using the reference induction voltage as described above or using a voltage applied to the primary winding.

<Fifth Determination Process>

In a manner similar to the fourth determination process, a fifth determination process detects a magnetic bias in the magnetic core 11 based on results of integrating an inner induction voltage or an outer induction voltage.

As described above, the inner and outer induction voltages Vin and Vout Indicate symmetric waveforms during the voltage application period in the normal state. However, the symmetry is lost if a magnetic bias occurs in the magnetic core 11.

Figure 18:
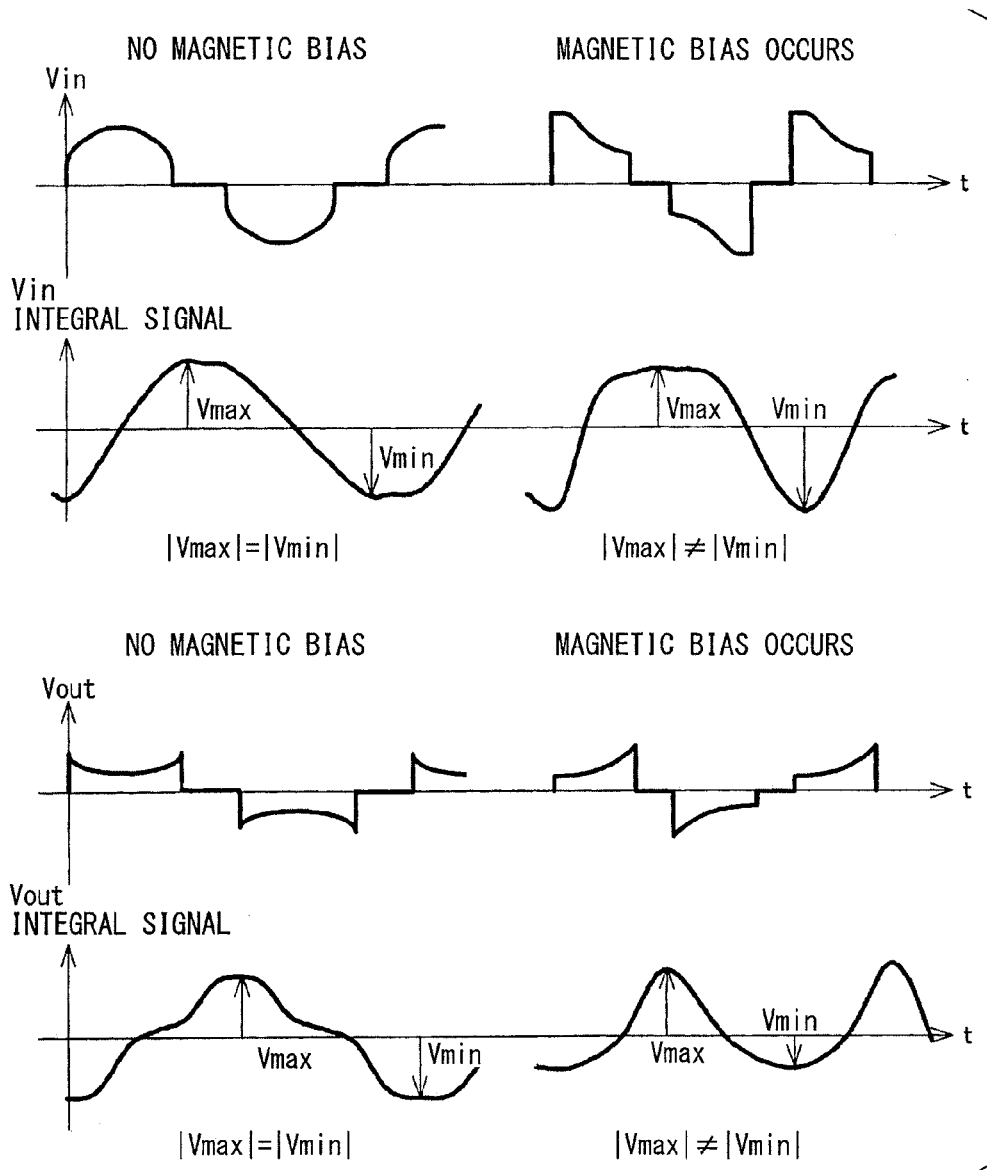
FIG. 18 is an explanatory diagram illustrating integral signals based on Induction voltages Vin and Vout at inner and outer detection windings provided for the corner of the transformer core depending on whether a magnetic bias occurs or not.

It is assumed that the inverter circuit 40 supplies the primary winding 12 with an AC voltage that keeps positive and negative voltage application periods and positive and negative amplitudes constant and the positive amplitude approximately (or completely) is equal to the negative amplitude. In such a case, if direct-current components are eliminated from integrated waveforms, maximum value Vmax and minimum value Vmin result from integrated values for the inner induction voltage Vin and the outer induction voltage Vout. The absolute value of Vmax is equal to the absolute value of Vmin in the normal state. However, the absolute values differ from each other if a magnetic bias occurs (see FIG. 18). Using this property, the fifth determination process detects a magnetic bias in the magnetic core 11.

Figure 19:
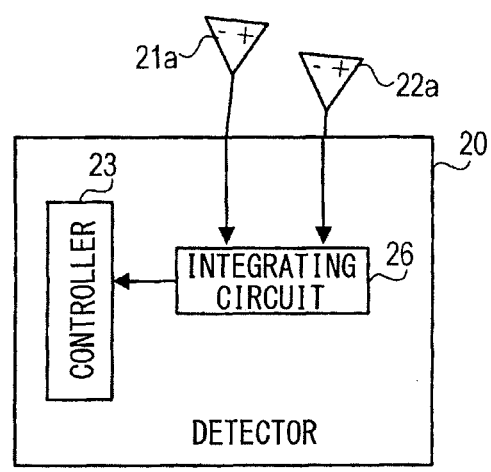
FIG. 19 is a block diagram illustrating a detector to perform a fifth determination process according to the first embodiment.

For this purpose, the detector 20 to perform the fifth determination process further includes the integrating circuit 26 that follows instructions from the controller 23 to integrate signals generated from an inner induction voltage or an outer induction voltage (see FIG. 19). The controller 23 measures an integral signal generated from the integrating circuit 26 for the inner induction voltage or the outer induction voltage. The controller 23 specifies a maximum measurement value and a minimum measurement value. The controller 23 compares these values to detect a magnetic bias generated in the magnetic core 11. The integrating circuit 26 has a function to eliminate direct-current components from integrated waveforms as well as the function to integrate signals.

Figure 20:
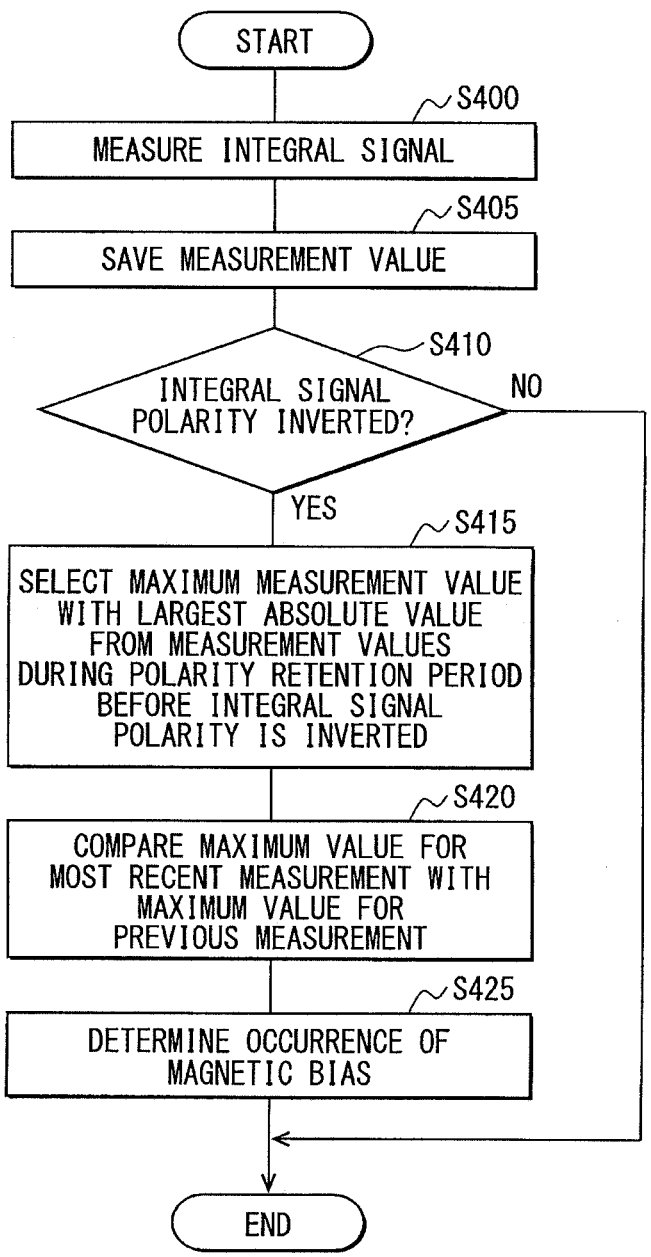
FIG. 20 is a flowchart showing the fifth determination process according to the first embodiment.

The fifth determination process will be described with reference to a flowchart in FIG. 20. The controller 23 of the detector 20 periodically performs fifth determination process. At S400, the controller 23 measures an integral signal for the inner induction voltage or the outer induction voltage generated from the integrating circuit 26. At S405, the controller 23 saves a measurement value.

At S410, the controller 23 compares the measurement value for the current integral signal with the measurement value for the previous integral signal and determines whether the integral signal polarity changes. If the determination is affirmed (Yes at S410), the controller 23 passes control to S415. If the determination is negated (No at S410), the controller 23 terminates the process.

In the following description, a polarity retention period signifies a period in which an integral signal remains the same polarity. At S415, the controller 23 selects a maximum measurement value with the largest absolute value from measurement values for integral signals during the polarity retention period before the integral signal polarity is inverted. The process then proceeds to S420.

At S420, the controller 23 compares the absolute value of the maximum measurement value corresponding to the last inverted polarity with the absolute value of the most recently specified maximum measurement value. The controller 23 determines an occurrence of magnetic bias if the absolute values are not equal completely or approximately (S425). The process then terminates. The controller 23 may determine the magnetic bias direction based on the magnitude relationship between the absolute values.

The determination method uses a result of integrating inner induction voltages. The determination method can detect a magnetic bias generated in the magnetic core 11 while suppressing the effect of a noise that may be generated from the inverter circuit 40 and may be superimposed on the inner induction voltage.

The method can eliminate the threshold value as used for the first determination process and detect a magnetic bias more easily. The method can easily detect a magnetic bias even if the value of a voltage applied to the primary winding 12 changes due to some reason while the voltage value remains constant during the voltage application period.

The detector 20 may perform the fifth determination process as described below without using the integrating circuit 26. The detector 20 is configured so that the controller 23 is supplied with inner and outer induction voltages via the amplifier circuits 21*a* and 22*a*. The controller 23 periodically samples inner and outer induction voltages, calculates an integrated value, and removes direct-current components from a waveform as an integration result. As a result, the controller 23 acquires a measurement value for the integral signal. The controller 23 uses the calculated integrated value instead of the measurement value and determines the presence or absence of magnetic bias similarly to fifth determination process.

The same effect is available even in this case. Even if no magnetic bias occurs, the inner or outer induction voltage may lose the symmetry when the primary winding 12 generates much leakage magnetic flux similarly to the fourth determination process.

In such a case, a normalized induction voltage can be used to appropriately restrict an incorrect determination in the fifth determination process. The normalized induction voltage is acquired by dividing an Inner induction voltage or an outer induction voltage by the reference induction voltage. During the voltage application period, an applied voltage cannot be assumed constant and therefore the inner induction voltage or the outer induction voltage becomes asymmetric. In such a case, these induction voltages may be replaced by a voltage normalized by the reference induction voltage or by the voltage applied to the primary winding.

<First Magnetic Saturation Elimination Process>

As described above, the first through fifth determination processes detect a magnetic bias generated in the magnetic core 11 and the magnetic bias direction. When the magnetic bias occurs, a magnetic saturation easily occurs if a voltage is applied to the primary winding 12 so that a magnetic flux occurs in the magnetic bias direction. The magnetic saturation may increase a loss or cause an excess excitation current to the winding.

When any of the first through fifth determination processes detects the magnetic bias direction, the controller 23 appropriately controls an inverter circuit 40 to adjust the positive voltage application period and the negative voltage application period for the primary winding 12.

The controller 23 can remove a positive magnetic bias by adjusting the negative voltage application period to be longer than the positive voltage application period. By contrast, the controller 23 can remove a negative magnetic bias by adjusting the positive voltage application period to be longer than the negative voltage application period.

The above-described control eliminates magnetic bias based on determination results of magnetic bias states. However, the present disclosure can detect magnetic saturation resulting from the magnetic bias and provide control to avoid the magnetic saturation based on determination results without directly determining magnetic bias states. The following describes in detail the detection of magnetic saturation and the control to avoid the magnetic saturation.

Under the control to be described, in a case where a voltage is applied to the primary winding 12 so that a magnetic flux occurs in the magnetic bias direction, the detector 20 transmits a stop signal to the inverter circuit 40 to temporarily stop applying the voltage to the primary winding 12 when the magnetic saturation in the magnetic core 11 reaches a given level.

Figure 21:
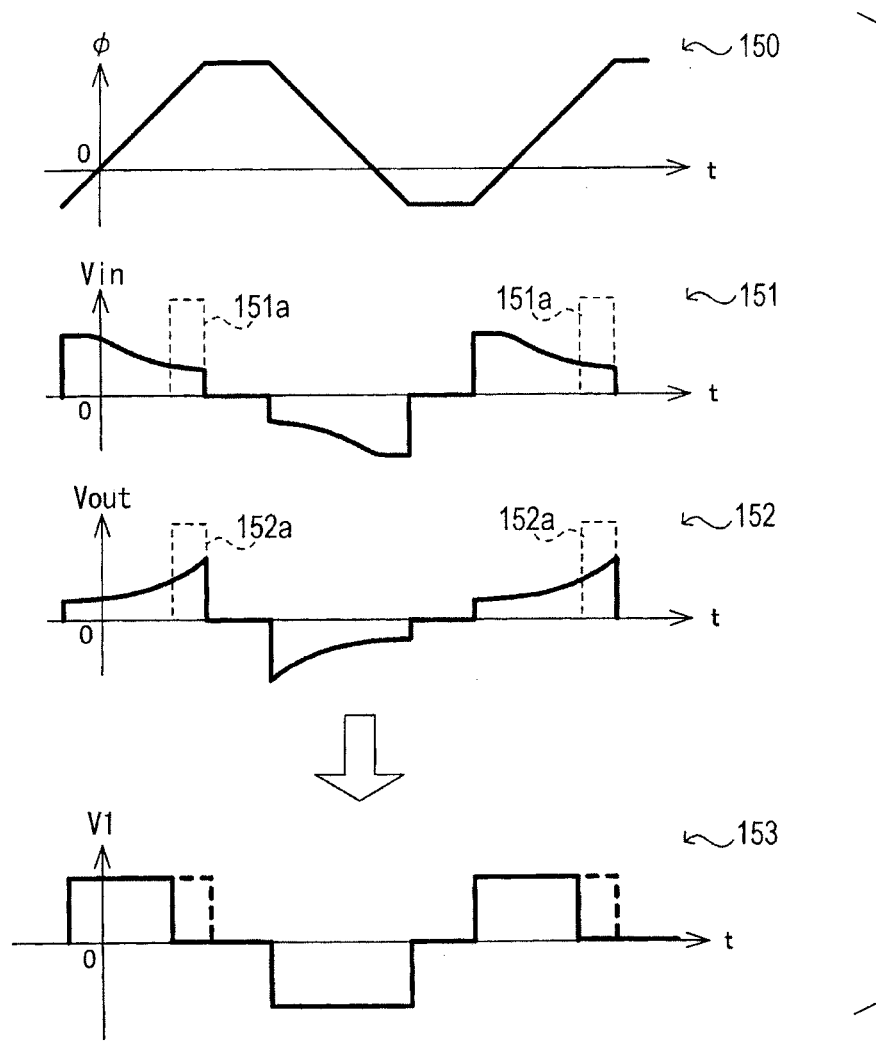
FIG. 21 is a graph showing voltages applied to the primary winding of the transformer when a first magnetic saturation elimination process according to the first embodiment is performed.

As illustrated in FIG. 21, graph 150 shows changes in magnetic flux φ of the magnetic core 11 where the positive magnetic bias occurs. Graphs 151 and 152 respectively show the inner induction voltage Vin and the outer induction voltage Vout when magnetic flux φ changes according to graph 150. In this case, period 151*a* in graph 151 or period 152*a* in graph 152 may cause excess magnetic saturation to the magnetic core 11 as a result of applying a voltage to the primary winding 12 in the magnetic bias direction (positive direction) to generate a magnetic flux.

Figure 22:
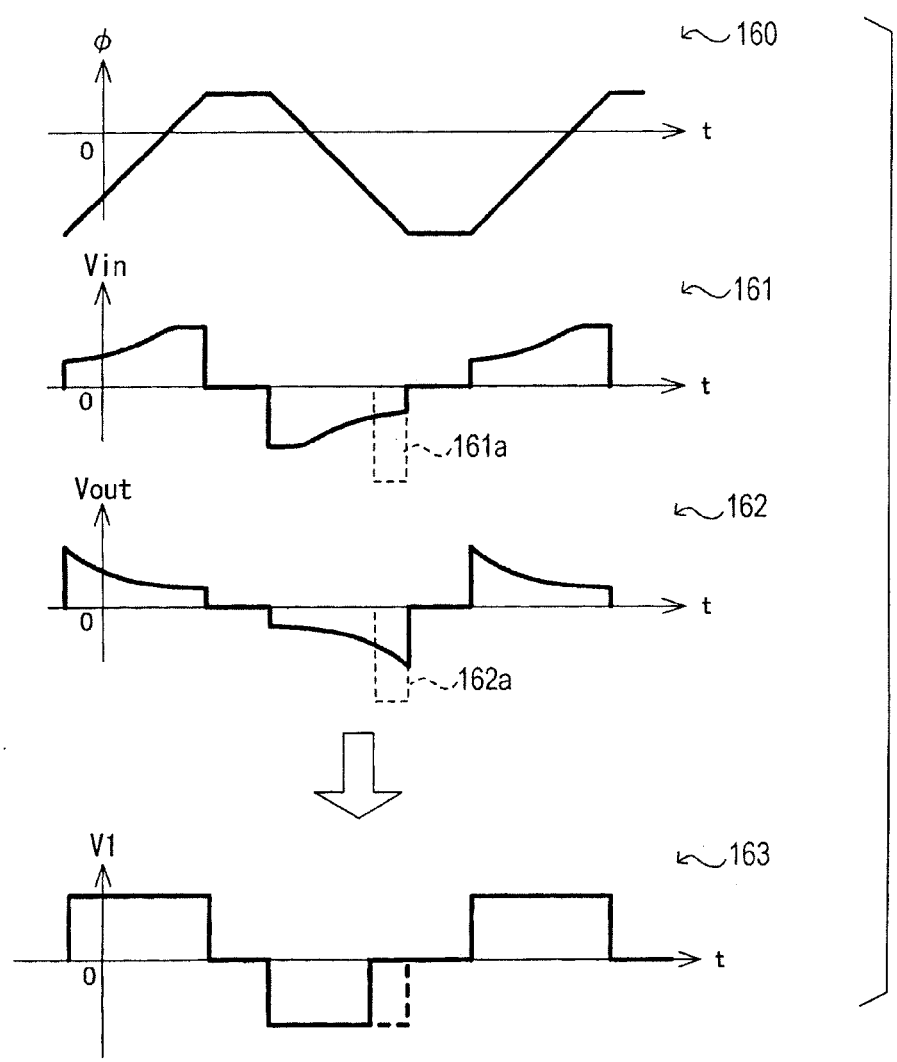
FIG. 22 is a graph showing voltages applied to the primary winding of the transformer when the first magnetic saturation elimination process according to the first embodiment is performed.

As illustrated in FIG. 22, graph 160 shows changes in magnetic flux φ of the magnetic core 11 where the negative magnetic bias occurs. Graphs 161 and 162 respectively show the inner induction voltage Vin and the outer induction voltage Vout when magnetic flux φ changes according to graph 160. In this case, period 161*a* in graph 161 or period 162*a* in graph 162 may cause excess magnetic saturation to the magnetic core 11 as a result of applying a voltage to the primary winding 12 in the magnetic bias direction (negative direction) to generate a magnetic flux.

If the detector 20 detects that the absolute value of the inner induction voltage Vin gradually decreases, and that the absolute value is smaller than a specified threshold value, the detector 20 assumes that the magnetic saturation reaches a given level. And if the detector 20 detects that the absolute value of the outer induction voltage Vout gradually increases and that the absolute value is greater than a specified threshold value, the detector 20 assumes that the magnetic saturation reaches a given level. Then, the detector 20 transmits a stop signal to the inverter circuit 40 to stop applying a voltage corresponding to the current polarity to the primary winding 12.

When receiving the stop signal, the inverter circuit 40 stops applying a voltage to the primary winding 12 up to the end of the voltage application period that applies the voltage corresponding to the current polarity to the primary winding 12. The potential of the primary winding 12 is equal to 0 V during the period (see graphs 153 and 156).

Figure 23:
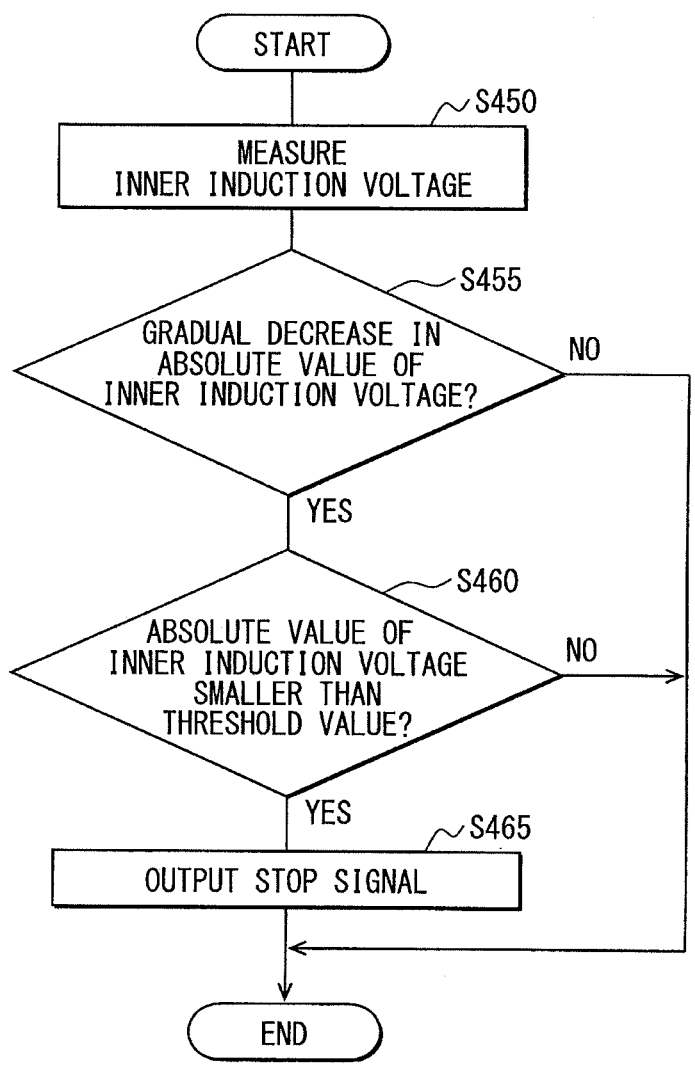
FIG. 23 is a flowchart showing the first magnetic saturation elimination process according to the first embodiment.

The first magnetic saturation elimination process to eliminate the above-mentioned magnetic saturation will be described with reference to a flowchart in FIG. 23. The controller 23 of the detector 20 periodically performs the first magnetic saturation elimination process.

At S450, the controller 23 of the detector 20 measures the inner induction voltage and passes control to S455. The controller 23 may measure the outer induction voltage instead of the inner induction voltage.

At S455, the controller 23 determines, based on the most recent result of measuring the inner induction voltage and the previous result of measuring the inner induction voltage, whether the absolute value of the inner induction voltage changes to non-zero and then the absolute value gradually decreases during a specified period. To measure the outer induction voltage instead of the inner induction voltage, the controller 23 determines, based on the most recent result of measuring the outer induction voltage and the previous result of measuring the outer induction voltage, whether the absolute value of the outer induction voltage changes to non-zero and then the absolute value gradually increases during a specified period.

If the determination is affirmed (Yes at S455), the controller 23 passes control to S460. If the determination is negated (No at S455), the controller 23 terminates the process.

At S460, the controller 23 determines whether the absolute value of the most recently measured inner induction voltage is smaller than a predetermined threshold value. To measure the outer induction voltage instead of the inner induction voltage, the controller 23 determines whether the absolute value of the most recently measured outer induction voltage is greater than a predetermined threshold value. If the determination is affirmed (Yes at S460), the controller 23 passes control to S465, assuming that the magnetic saturation reaches a specified level. If the determination is negated (No at S460), the controller 23 terminates the process.

At S465, the controller 23 outputs a stop signal to the inverter circuit 40 and terminates the process. The above-mentioned configuration can restrict excess magnetic saturation from generating in the magnetic core 11, losses from increasing, or an excess excitation current from generating in the windings.

<Modifications of First Magnetic Saturation Elimination Process>

The following describes modifications of the first magnetic saturation elimination process. In the first magnetic saturation elimination process described above, the controller 23 determines whether the absolute value of the inner induction voltage gradually decreases or whether the absolute value of the outer induction voltage gradually increases. The controller 23 compares the absolute value of the inner or outer induction voltage with the threshold value. Based on a comparison result, the controller 23 determines whether excess magnetic saturation occurs.

However, the controller 23 of the detector 20 may include the above-mentioned first through fifth determination processes and specify the magnetic bias direction based on the results. In addition, based on an inner or outer induction voltage, the controller 23 may determine whether a voltage is applied to the primary winding in the magnetic bias direction to generate a magnetic flux.

If the determination is affirmed, the controller 23 may determine that the magnetic saturation reaches a specified level when the absolute value of the inner induction voltage becomes smaller than the threshold value or when the absolute value of the outer induction voltage becomes greater than the threshold value. The controller 23 may then transmit a stop signal to the inverter circuit 40.

Also in this case, it is possible to restrict excess magnetic saturation from generated in the magnetic core 11, losses from increasing, or an excess excitation current from generated in the windings. A threshold value used for the first magnetic saturation elimination process or the modification depends on the amplitude of AC voltage applied to the primary winding 12 from the inverter circuit 40. If the amplitude is fixed, a threshold value may be predetermined and may be stored in ROM of the controller 23.

If the amplitude is variable, the controller 23 may calculate the amplitude based on a voltage signal from the inverter circuit 40 and set a threshold value based on a calculation result when measuring an inner or outer induction voltage at S450 of the first magnetic saturation elimination process. At S460, the controller 23 may compare the measurement value for the inner or outer induction voltage with the threshold value to detect that the magnetic saturation reaches a specified level.

At S450, the controller 23 may calculate the amplitude based on a voltage signal. At S460, the controller 23 may normalize the measurement value for the inner or outer induction voltage using the amplitude and compare the normalized measurement value with the predetermined threshold value to detect that the magnetic saturation reaches a specified level.

The magnetic bias can be detected appropriately as described above. The primary winding 12 may leak much magnetic flux that does not pass through the magnetic core 11. In such a case, time derivative dϕ/dt for the entire magnetic flux amount ϕ passing through the magnetic core 11 does not fully reflect a voltage applied to the primary winding 12. As a result, excess magnetic saturation may not be detected properly even if a threshold value is calculated based on the amplitude of an AC voltage applied to the primary winding 12 or the amplitude is used to normalize the measurement value for an inner or outer induction voltage.

If the insulated power supply 1 is provided with the reference winding 50 (see FIG. 3), an induction voltage from the reference winding 50 reflects time derivative dϕ/dt for the entire magnetic flux amount ϕ passing through the magnetic core 11 even if the primary winding 12 generates much leakage magnetic flux. The above-mentioned threshold value is set based on an inner or outer induction voltage in the normal state and corresponds to the reference induction voltage induced by the reference winding 50.

Therefore, if the amplitude is variable, the controller 23 may further measure the reference induction voltage and set a threshold value based on a measurement result when measuring an inner or outer induction voltage at S450 of the first magnetic saturation elimination process. At S460, the controller 23 may compare the measurement value for the inner or outer induction voltage with the threshold value to detect that the magnetic saturation reaches a specified level.

Alternatively, the controller 23 may further measure the reference induction voltage at S450. At S460, the controller 23 may normalize a measurement value for the inner or outer induction voltage using the reference induction voltage and compare the normalized measurement value with the predetermined threshold value to detect that the magnetic saturation reaches a specified level.

Excess magnetic saturation can be detected appropriately as described above even if much magnetic flux leaks. This configuration of the insulated power supply 1 can be simplified because the inverter circuit 40 needs not supply a voltage signal to the detector 20.

[Corner Shapes]

The following describes in detail the corner 11a of the magnetic core 11 of the transformer 10. As described above, the magnetic flux density in a cross section across the magnetic flux distributes strongly inhomogeneously at a sharp corner or a sharply curved portion of the magnetic core. In the first embodiment, the corner 11a of the magnetic core 11, which is provided with the detection winding, is bent at 90 degrees. Thus, the magnetic flux density in the non-uniform cross section at the corner 11a can distribute strongly inhomogeneously. Therefore, an induction voltage at the detection winding remarkably indicates the effect of the magnetic saturation, and a magnetic bias can be easily detected based on the induction voltage.

Decreasing the angle of the corner 11a increases the inhomogeneity of distribution in magnetic flux density in the non-uniform cross section at the corner 11a. This enables to more easily detect the magnetic bias based on an induction voltage. As described in the first embodiment, setting the corner 11a to 90 degrees or less is favorable to sensitively detect the magnetic bias.

Obviously, the magnetic core may be provided with the detection winding at a corner whose bending angle is 90 degrees or more. In such a case, it is also possible to similarly detect a magnetic bias and a magnetic bias direction in the magnetic core based on an induction voltage at the detection winding.

The curvature of an inner magnetic flux line increases at a corner or a curved portion of the magnetic core resulting in increasing a length difference between the inner magnetic path and the outer magnetic path. As a result, the inhomogeneous distribution in magnetic flux densities increases. However, the inhomogeneity is assumed to decrease if there is a small distance between the inner surface and the outer surface. If the corner or the curved portion is narrow, only increasing the bend can sufficiently increase the inhomogeneity in magnetic flux density distribution. Otherwise, it is difficult to detect a magnetic bias based on an induction voltage from the detection winding provided at the location.

To solve this problem, the width of the corner 11a of the magnetic core 11 is adjusted so that a value resulting from dividing the maximum curvature radius at the location by the maximum width at the location is smaller than or equal to a specified value. For example, the first embodiment assumes the specified value to be 2. Alternatively, the maximum curvature radius of the corner 11a may be replaced by an average curvature radius at the corner 11a. The maximum width of the corner 11a may be replaced by an average width at the corner 11a.

This can sufficiently Increase the inhomomgeneity in magnetic flux density distribution at the corner 11a. It is possible to easily detect a magnetic bias based on an induction voltage from the detection winding provided at the location.

[Detection Windings]

The following describes in detail the inner and outer detection windings 21 and 22. As described above, the magnetic flux density at an inner or outer portion of the corner 11a of the magnetic core 11 is prone to be affected by magnetic saturation when the entire magnetic core 11 increases a magnetic flux.

As described in the first embodiment, the detection winding is provided to wind around the inner or outer surface of the corner 11a. This enables to remarkably reflect an effect of magnetic saturation on an induction voltage from the detection winding and more easily detect the magnetic bias based on the induction voltage.

Figure 2:
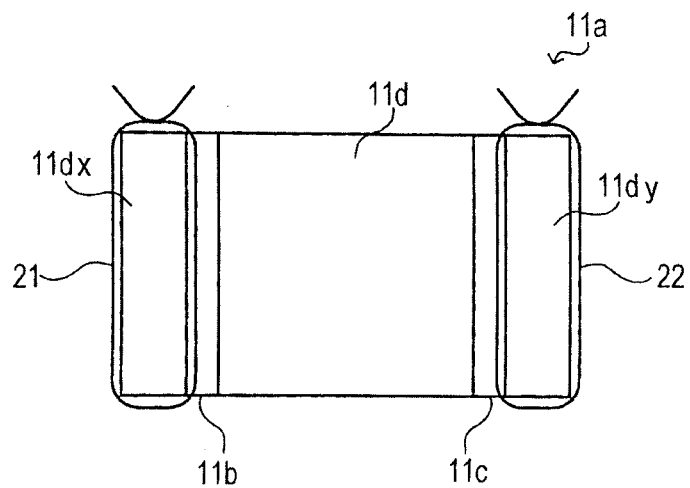
FIG. 2 is a cross-sectional view of a transformer core taken along line II-II in FIG. 1.

As illustrated in FIG. 2, the inner and outer detection windings 21 and 22 according to the first embodiment wind around the non-uniform cross section. A ratio of an area of each partial region on the non-uniform cross section to the entire non-uniform cross section is smaller than or equal to a specified value. The specified value depends on the magnetic permeability of the magnetic core and is set to, for example, 1/2 according in the first embodiment.

This can enlarge a difference between the magnetic flux density of the entire non-uniform cross section and the magnetic flux density of the partial region. It is possible to remarkably reflect an effect of magnetic saturation on an induction voltage from the detection winding and more easily detect the magnetic bias based on the induction voltage.

When detecting a magnetic bias of differently shaped magnetic cores used for other transformers, flyback transformers, reactors, and switched reluctance motors, as will be described, it may be favorable to similarly assume a ratio of an area of the partial region to the entire non-uniform cross section to be smaller than or equal to a specified value (e.g., 1/2). This can more easily detect a magnetic bias.

Nonetheless, the disclosure is not limited thereto. It may be favorable to adjust the detection winding position or the hole position so that an area of the partial region is half or more of an area of the entire non-uniform cross section. The magnetic core 11 may be provided with one of the inner detection winding 21 and the outer detection winding 22. Even with one detection winding, the first, second, fourth, and fifth determination processes can be performed to detect a magnetic bias and the first magnetic saturation elimination process can be performed.

According to the first embodiment, the non-uniform cross section is formed by connecting edges on the inner and outer surfaces of the corner 11a. Alternatively, the non-uniform cross section may consist of one or more non-uniform cross sections that intersect with a magnetic flux at the corner 11a. Then, a hole may be formed through the magnetic core 11 along the non-uniform cross section, and a detection winding may be provided to surround the inner or outer side of the magnetic core 11. The non-uniform cross section is not necessarily flat. The hole is not necessarily straight.

Figure 24:
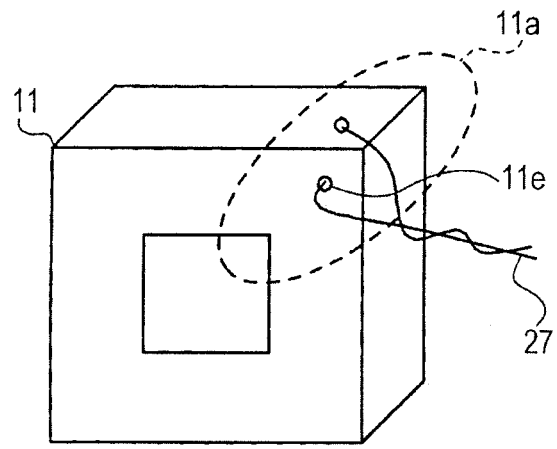
FIG. 24 is an explanatory diagram illustrating an example of the detection winding provided for the corner of the transformer core.

As illustrated in FIG. 24, a hole 11e may be formed so as to penetrate the magnetic core 11 from the upper or lower surface of the corner 11a to the outer side. And, a detection winding 27 may be provided to pass through the hole 11e and surround the outer side of the corner 11a.

Figure 25:
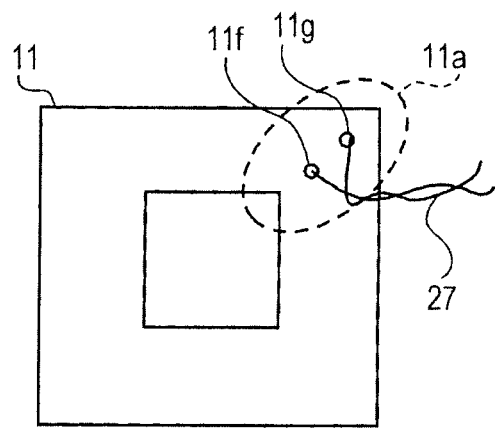
FIG. 25 is an explanatory diagram illustrating an example of the detection winding provided for the corner of the transformer core.

The magnetic flux density at locations other than the inner or outer vicinity of the corner 11a is considered prone to be affected by magnetic saturation when the entire magnetic core 11 increases a magnetic flux. In consideration of this, two holes 11f and 11g may be formed as illustrated in FIG. 25 approximately at the center of the corner 11a so as to penetrate the corner 11a from the upper surface to the lower surface. A detection winding 27 may be provided to pass through the holes 11f and 11g and surround the partial region of the non-uniform cross section without contact with the inner and outer sides of the corner 11a.

The same effect is available even in this case. The center of the non-uniform cross section at the corner 11a may contain a region whose magnetic flux density is equal to the magnetic flux density of the entire non-uniform cross section. Providing a detection winding around such a region is equal to providing a detection winding around the entire magnetic core 11. It is considered impossible to detect a magnetic bias based on an induction voltage from the detection winding.

Hence, the magnetic flux density of the partial region needs to differ from the magnetic flux density of the entire non-uniform cross section. Therefore, positions or shapes of the holes 11f and 11g need to be adjusted when providing the detection winding 27 around a partial region of the non-uniform cross section without contact with the side of the corner 11a.

In addition, there may be a partial region (e.g., a partial region corresponding to the upper or lower half of the non-uniform cross section) surrounded by a line separating the non-uniform cross section parallel to the upper or lower surface of the corner 11a and the periphery of the non-uniform cross section, for example. The magnetic flux density of such a partial region may equal the magnetic flux density of the entire non-uniform cross section. To solve this problem, the hole positions need to be adjusted so that the detection winding does not wind around this partial region.

Depending on magnetic core shapes, it may be difficult to provide a hole penetrating a corner or position the detection winding at the corner. In such a case, the detection winding may be provided as follows.

Figure 26:
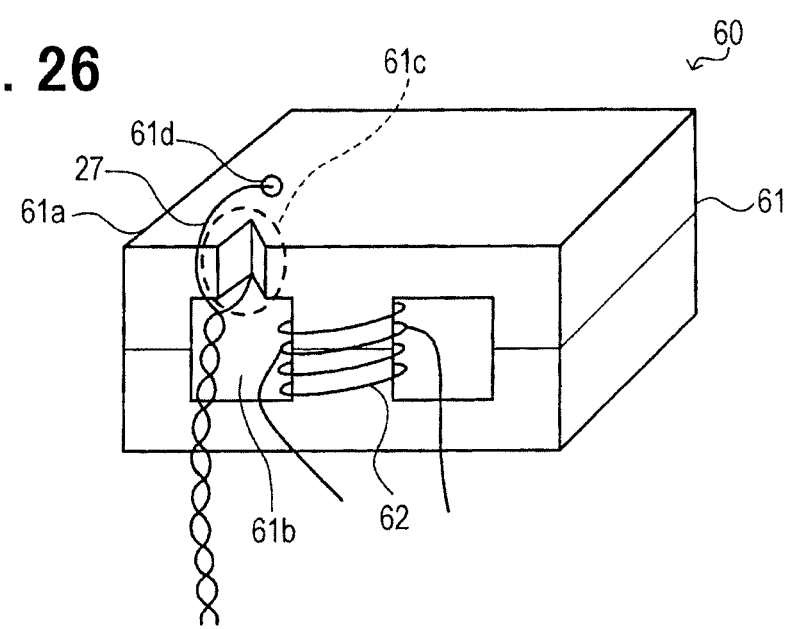
FIG. 26 is an explanatory diagram illustrating an example of the detection winding provided for a notch in a planar transformer core.

As illustrated in FIG. 26, a magnetic core 61 of a planar transformer 60 includes an upper portion 61a formed as a principal surface. A notch 61c is formed in the upper portion 61a adjacently to a hollow 61b. A hole 61d is formed adjacently to the notch 61c so as to penetrate the upper portion 61a in the thickness direction of the magnetic core 61. The detection winding 27 is provided to pass through the hole 61d and wind around the vicinity of the notch 61c.

Applying a voltage to the primary winding 62 generates the magnetic flux. The flux line increases the curvature near the notch 61c in the magnetic core 61. Because the notch 61c is formed on the flat upper portion 61a, a length difference increases between the magnetic flux line passing through the front side magnetic path bent by the notch 61c and the magnetic flux line passing through the rear side. Consequently, the magnetic flux density remarkably distributes inhomogeneously near the notch 61c. The magnetic flux density around the notch 61c is prone to an effect of magnetic saturation when the entire magnetic core 61 increases a magnetic flux.

For this reason, the detection winding is provided around the vicinity of the notch 61c. This enables to remarkably reflect an effect of magnetic saturation on an induction voltage and easily detect the magnetic bias based on the induction voltage.

For example, a projected portion may be formed on the external surface of the magnetic core 61. A hole may be provided to penetrate near the projected portion. There may be provided a detection winding whose wire passes through the hole and winds around the vicinity of the projected portion. Magnetic cores of other transformers as well as the planar transformer 60 may also be provided with the notch and the projected portion, the adjacent hole penetrating the magnetic core, and the detection winding as described above. In this case, it is also possible to easily detect a magnetic bias based on an induction voltage from the detection winding provided.

(Second Embodiment)

[Configuration]

A configuration of an insulated power supply 1 according to a second embodiment of the present disclosure will be described. The insulated power supply 1 according to the second embodiment differs from the first embodiment in the configuration of the detection winding.

Figure 27:
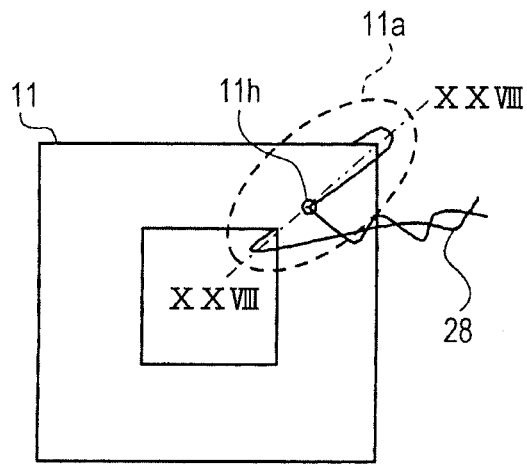
FIG. 27 is an explanatory diagram illustrating a double detection winding provided for the corner of a transformer core according to a second embodiment.

As illustrated in FIG. 27, the second embodiment forms one hole 11h at the corner 11a of the magnetic core 11 for the transformer 10. The hole 11h penetrates the corner 11a from the upper surface to the lower surface. A wire is inserted into the hole 11h and is wound around the corner 11a in a figure of eight to configure a double detection winding 28.

Figure 28:
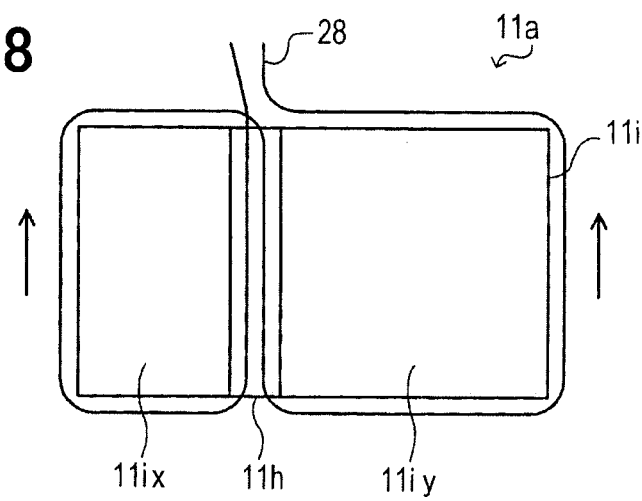
FIG. 28 is a sectional view illustrating the corner of the transformer core according to the second embodiment.

Specifically, as illustrated in FIG. 28, an non-uniform cross section 11I (cross section taken along line XXVIII-XXVIII in FIG. 27) is formed along the hole 11h in the corner 11a. The hole 11h divides the non-uniform cross section 11i into two regions, that is, a first region 11ix positioned toward the inside and a second region 11y positioned toward the outside.

To configure the double detection winding 28, a wire is inserted into the hole 11h and is clockwise wound around the periphery of the first region 11ix. The wire is again inserted into the hole 11h and is counterclockwise wound around the periphery of the second region 11iy. The wire used for the double detection winding 28 is wound around each region by a specified number of turns, respectively.

[Bias Detection Method]

According to the second embodiment, the double detection winding 28 winds around the periphery (first portion) of the first region 11ix and the periphery (second portion) of the second region 11ly. When the magnetic flux of the magnetic core 11 changes, voltages of different polarities are induced to the first and second portions. The sum of induction voltages generated at the portions is equal to the induction voltage (also referred to as a total induction voltage) of the entire double detection winding 28.

The first portion causes an induction voltage in the same patterns (see graph 124 in FIG. 6, graph 131 in FIG. 7, and graph 141 in FIG. 8) as for the inner induction voltage Vin generated at the inner detection winding 21 according to the first embodiment.

The second portion causes an induction voltage in the same patterns (see graph 125 in FIG. 6, graph 132 in FIG. 7, and graph 142 in FIG. 8) as for the outer induction voltage Vout generated at the outer detection winding 22 according to the first embodiment.

The induction voltage at the first portion corresponds to the induction voltage at the inner detection winding 21. The induction voltage at the second portion corresponds to the induction voltage at the outer detection winding 22. The wires are wound around the respective regions in opposite directions. Therefore, the induction voltages corresponding to the regions indicate different polarities. The total induction voltage is equal to a difference between the inner Induction voltage and the outer induction voltage.

The following describes the method of detecting a magnetic bias based on changing patterns for the total induction voltage.

<First, Second, Forth, and Fifth Determination Processes>

The total induction voltage is equal to a difference between the inner and outer induction voltages. Therefore, the first, second, fourth, or fifth determination process according to the first embodiment can be performed by replacing the inner and outer induction voltages with the total induction voltage to detect a magnetic bias or the magnetic bias direction.

Magnitudes of the induction voltages corresponding to the first and second portions can be adjusted by adjusting the number of turns of the wire wound around the first region 11ix of the first portion in the double detection winding 28 and the number of turns of the wire wound around the second region 11iy of the second portion in the same.

As a result, this enables the time derivative of the total induction voltage to be greater. It is possible to improve the magnetic bias detection sensitivity and to easily and reliably detect a magnetic bias compared to the detection of magnetic bias in the magnetic core 11 based on inner and outer induction voltages.

The detector 20 according to the second embodiment may perform the first determination process to detect a magnetic bias. In this case, the threshold value can be set to 0 V (reference voltage) by adjusting the respective number of turns of the wires corresponding to the first and second portions according to the magnitude of magnetic flux generated from the magnetic core 11 or areas of the first and second regions 11ix and 11iy.

If the first portion is equal to the second portion in area, the induction voltage for the first portion is higher than the induction voltage for the second portion. Therefore, this generally needs that the number of turns corresponding to the second portion is greater than the number of turns corresponding to the first portion.

As a result, even if a voltage applied to the primary winding changes, a magnetic bias or a magnetic bias direction can be detected without changing the threshold value or normalizing an induction voltage at the double detection winding 28. Owing to this, the processes can be simplified. Alternatively, the threshold value can be set to 0 V by adjusting the position of the hole 11h.

<Third Determination Process>

The third determination process according to the first embodiment detects a magnetic bias in the magnetic core 11 based on difference in time in the result of comparison between the inner induction voltage and the outer induction voltage. On the other hand, the total induction voltage corresponds to a difference between the inner induction voltage and the outer induction voltage and indicates a result of comparison between the inner induction voltage and the outer induction voltage. According to the same concept as the third determination process, the total induction voltage can be used to detect a magnetic bias or the magnetic bias direction.

For example, determination period Th1 may be assumed after the voltage application period begins till the total induction voltage exceeds a specified threshold value. Determination period Th2 may be assumed after the total induction voltage becomes smaller than the threshold value till the voltage application period ends.

The controller 23 of the detector 20 measures the determination periods based on the total induction voltage during the voltage application period. The controller 23 compares the determination periods. If a difference between the periods is greater than or equal to a specified value, the controller 23 may determine that a magnetic bias occurs in the magnetic core 11. The controller 23 may determine the magnetic bias direction based on which of the determination periods is longer.

The threshold value can be set to 0 V (reference voltage) by adjusting the numbers of turns of the wires corresponding to the first and second portions according to the magnitude of magnetic flux generated from the magnetic core 11 or areas of the first and second regions 11ix and 11iy.

Accordingly, even if a voltage applied to the primary winding 12 may vary, a magnetic bias or a magnetic bias direction can be detected without changing the threshold value or normalizing an induction voltage at the double detection winding 28, and the processes can be simplified.

<Magnetic Saturation Elimination Process>

Next, the magnetic saturation elimination process according to the second embodiment will be described. The total induction voltage is equal to a difference between an inner induction voltage and an outer induction voltage. Therefore, similarly to the first embodiment, it is possible to detect excess magnetic saturation based on change in the total induction voltage and stop applying a voltage to the primary winding 12.

Similarly to the inner induction voltage, the total induction voltage changes with magnetic flux $\phi$ passing through the magnetic core 11. A large total induction voltage is induced when magnetic flux $\phi$ is small. A small total induction voltage is induced when magnetic flux $\phi$ is large. Therefore, the first magnetic saturation elimination process can be performed similarly to the first embodiment.

However, the total induction voltage may become negative if magnetic flux $\phi$ is sufficiently large. In this case, at S450 in FIG. 23, the measurement result is multiplied by 1 or −1 as needed so that the induction voltage polarity becomes positive when magnetic flux $\phi$ is small. Then, S455 and S460 use the result of S450 instead of the absolute value. The specified value at S460 may be negative.

The threshold value can be set to 0 V (reference voltage) by adjusting the numbers of turns of the wires corresponding to the first and second portions. In this case, for example, the controller 23 of the detector 20 may assume that the magnetic saturation reaches a specified level at the time point when the total induction voltage gradually decreases to be below 0 V or gradually increases to be over 0 V during each voltage application period. The controller 23 may then transmit a stop signal to the inverter circuit 40.

Even if a voltage applied to the primary winding 12 changes, it is possible to restrict excess magnetic saturation from generated in the magnetic core 11, losses from increasing, or an excess excitation current from generated in the windings without changing the threshold value or normalizing an induction voltage at the double detection winding 28.

[Modifications]

The above-mentioned double detection winding 28 is formed by inserting a wire into one hole 11h several times and is wound around the corner 11a of the magnetic core 11 in a figure of eight. However, the disclosure is not limited thereto. For example, two holes may be formed toward the inside and the outside of the corner 11a. The first region may be positioned between the inner hole and the inner surface of the corner 11a. The second region may be positioned between the outer hole and the outer surface of the corner 11a. The double detection winding may be configured under this condition.

Alternatively, the first region may be positioned between the outer hole and the inner surface of the corner 11a. The second region may be positioned between the inner hole and the outer surface of the corner 11a. That is, the first region and the second region may partially overlap with each other. A wire may be wound around the first region periphery clockwise and then around the second region periphery counterclockwise to configure the double detection winding.

The position of the hole 11g in the corner 11a may be adjusted so that a ratio of each area of the first and second regions to the entire non-uniform cross section including these regions is smaller than or equal to a specified value (e.g., 1/2). This enables to remarkably reflect an effect of magnetic saturation on an Induction voltage corresponding to each region and easily detect the magnetic bias based on the total induction voltage.

Figure 29:
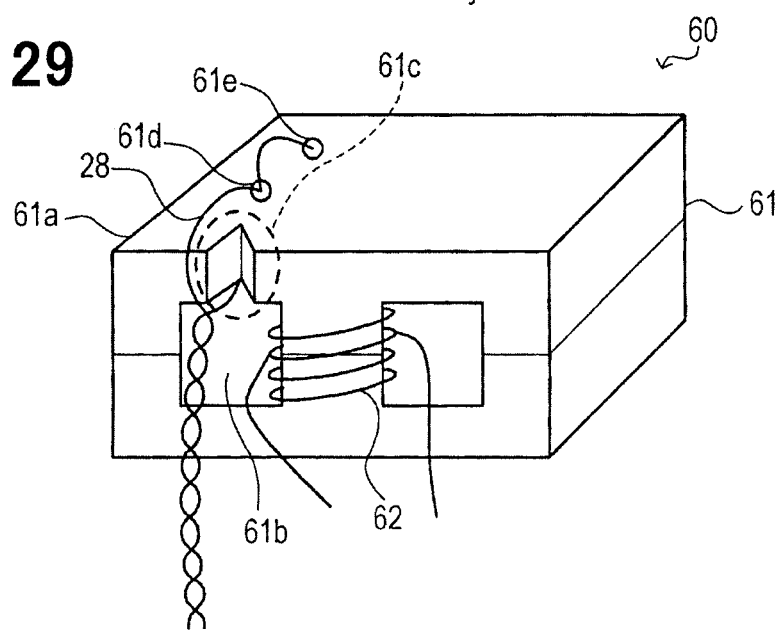
FIG. 29 is an explanatory diagram illustrating a double detection winding provided for a planar transformer according to the second embodiment.

FIG. 29 illustrates detection of a magnetic bias in the magnetic core 61 of the planar transformer 60. In this case, the notch 61c may be formed in the upper portion 61a adjacently to the hollow 61b. The upper portion 61a is formed as a principal surface of the magnetic core 61. Two holes 61d and 61e may be formed along the hollow 61b to penetrate the upper portion 61a in the thickness direction of the magnetic core 61.

The first region may be positioned between the notch 61c and the hole 61d adjacent to the notch 61c. The second region may be positioned between the two holes 61d and 61e. A wire may be wound around the first region periphery clockwise and then around the second region periphery counterclockwise to configure the double detection winding 28.

The double detection winding is configured by winding a wire around the peripheries of two different regions, which may be separated or partially overlapping with each other, on the non-uniform cross section, which may be flat or curved, in opposite directions. As a result, the same effects are available.

(Third Embodiment)

Figure 30:
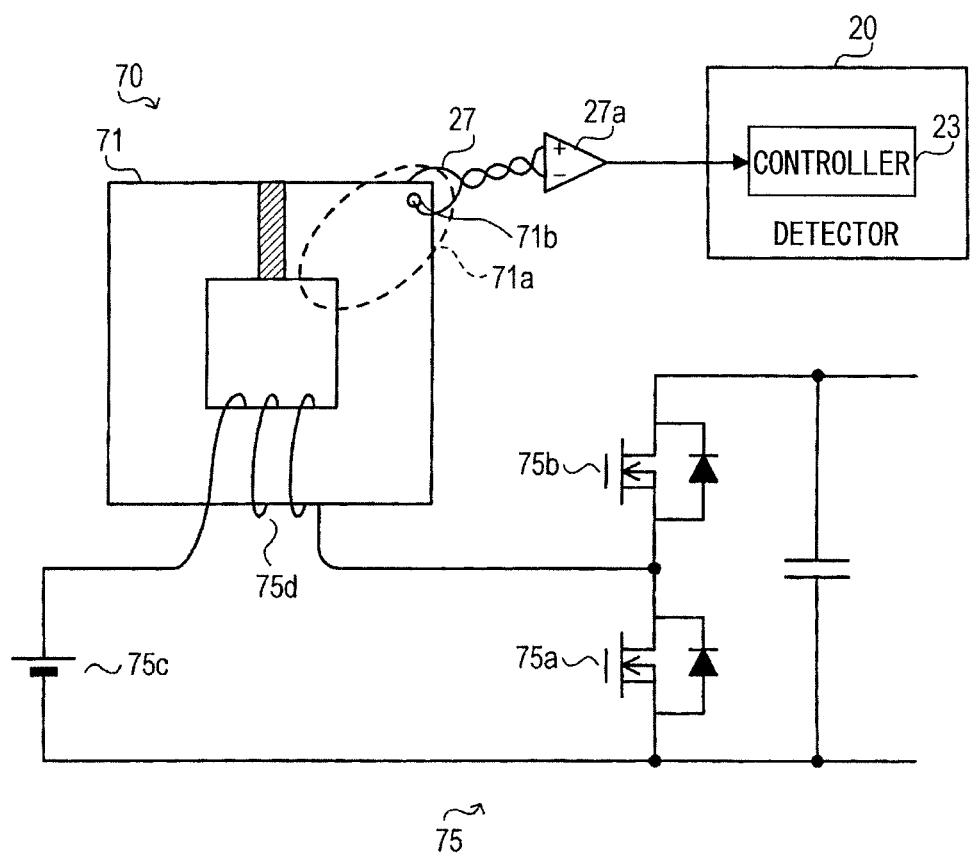
FIG. 30 is an explanatory diagram illustrating a configuration of a reactor according to a third embodiment.

In a third embodiment of the present disclosure, the above-mentioned detector 20 detects an amount of the direct-current magnetic flux. Based on the amount of the direct-current magnetic flux, the detector 20 detects magnetic saturation states of a magnetic core 71 in a reactor 70 provided for a boost chopper circuit 75 (see FIG. 30). The boost chopper circuit 75 includes a DC power supply 75c and first and second switching elements 75a and 75b as well as the reactor 70.

Similarly to the first embodiment, for example, the reactor 70 has a hole 71b in the outer part of a corner 71a of the rectangular annular magnetic core 71. The reactor 70 is provided with the detection winding 27 formed by inserting a wire into the hole 71b and winding the wire around the outer surface of the corner 71a. The controller 23 of the detector 20 is supplied with an induction voltage amplified by the amplifier circuit 27a.

The boost chopper circuit 75 alternates two states. One state turns on the first switching element 75a and turns off the second switching element 75b. The other state turns off the first switching element 75a and turns on the second switching element 75b. Consequently, a voltage applied to a coil 75d changes with states of the first and second switching elements 75a and 75b. The magnetic core 71 of the reactor 70 accordingly changes magnetic flux.

Figure 31:
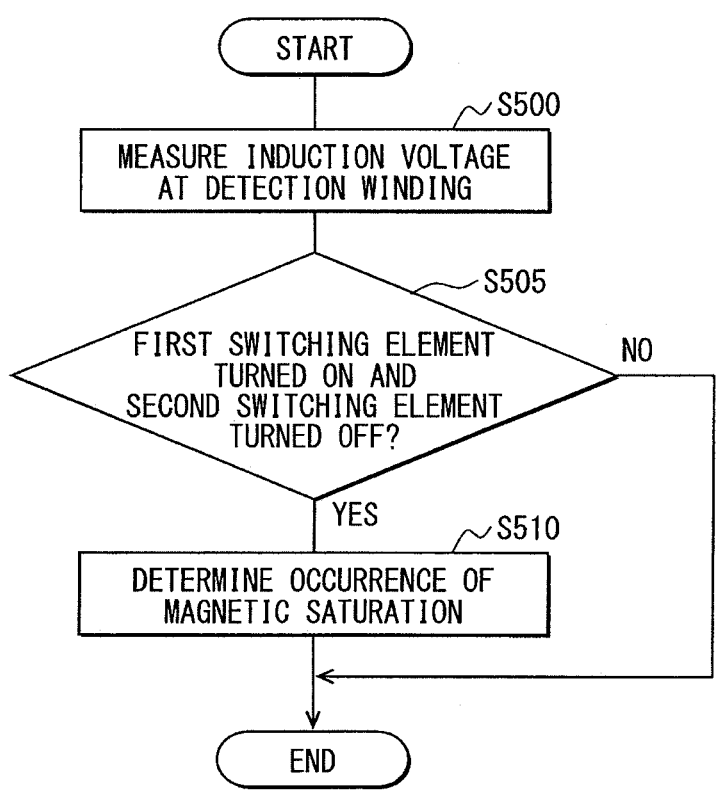
FIG. 31 is a flowchart showing a sixth determination process according to the third embodiment.

The controller 23 of the detector 20 detects magnetic saturation states of the magnetic core 71 based on the magnitude of DC magnetic flux generated from the magnetic core 71 of the reactor 70. A sixth determination process to detect magnetic saturation states of the magnetic core 71 will be described with reference to a flowchart in FIG. 31. The controller 23 of the detector 20 periodically performs the sixth determination process.

At S500, the controller 23 of the detector 20 measures an induction voltage at the detection winding 27 and passes control to S505. At S505, the controller 23 determines, based on change in an induction voltage, whether the first switching element 75a is turned on and the second switching element 75b is turned off. The induction voltage change is specified from a result of measuring the induction voltage for a specified number of times. If the determination is affirmed (Yes at S505), the controller 23 passes control to S510. If the determination is negated (No at S505), the controller 23 terminates the process.

At S510, based on a measurement value for the induction voltage, the controller 23 detects an amount of the DC magnetic flux formed in the magnetic core 71. The controller 23 determines whether the amount of the DC magnetic flux reaches a specified level. If the determination is affirmed, the controller 23 terminates the process, assuming that the magnetic core 71 is magnetically saturated.

Specifically, the controller 23 determines the amount of the DC magnetic flux as follows. The controller 23 normalizes the measurement value for the induction voltage using a voltage value of the DC power supply 75c of the boost chopper circuit 75. The controller 23 then determines whether the normalized measurement value exceeds a specified threshold value. Obviously, the determination method or the threshold value depends on the arrangement position of the detection winding 27.

The position of the hole 71b and the arrangement method for the detection winding 27 are not limited thereto. The detection winding 27 may be placed to surround the inner surface of the corner 71a. The detection winding 27 may be configured as a double detection winding according to the second embodiment.

This enables to detect an occurrence of magnetic saturation on the magnetic core 71 of the reactor 70 while restricting an increase in costs and a decrease in the magnetic core strength. The detected amount of the DC magnetic flux may be reflected on various controls concerning the boost chopper circuit 75.

(Fourth Embodiment)

Figure 32:
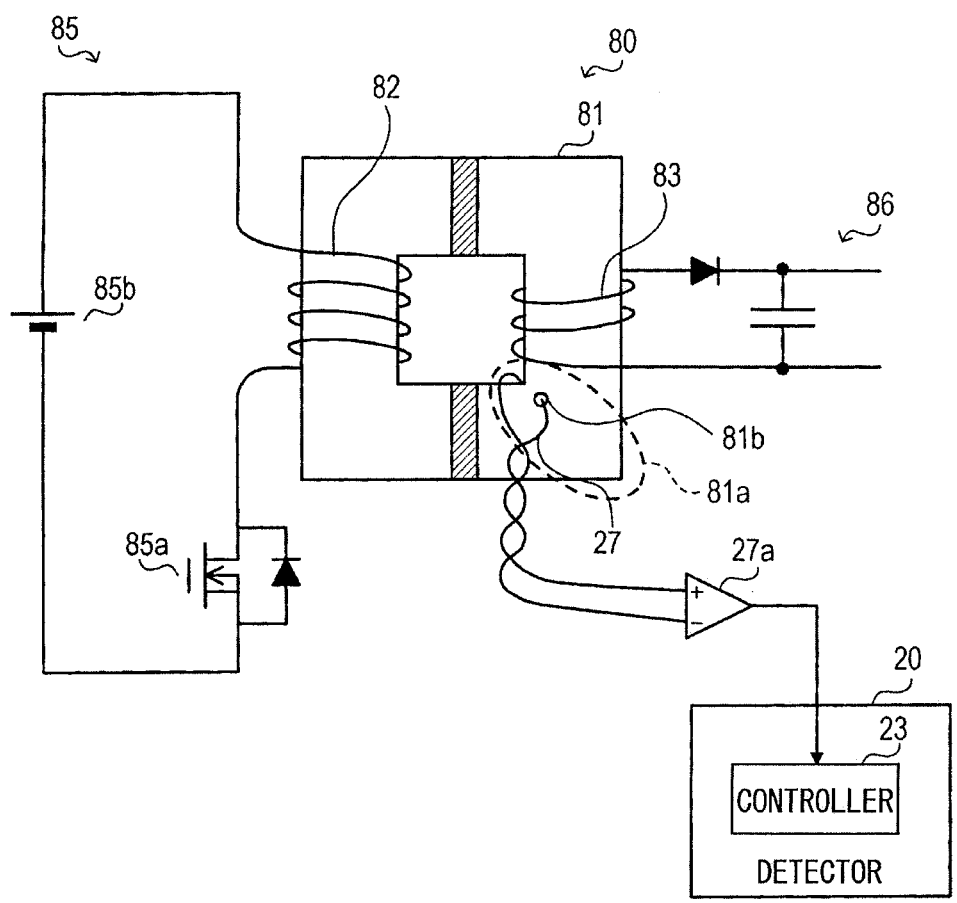
FIG. 32 is an explanatory diagram illustrating a configuration of a flyback transformer according to a fourth embodiment.

In a fourth embodiment of the present disclosure, the detector 20 detects an amount of DC magnetic flux. Based on the amount of magnetic flux, the detector detects an occurrence of magnetic saturation on a magnetic core 81 of a flyback transformer 80. FIG. 32 illustrates a primary circuit 85 and a rectifier circuit 86. The primary circuit 85 includes a switching element 85a. The primary circuit 85 supplies a primary winding 82 of the flyback transformer 80 with a DC voltage generated from a DC power supply 85b. The rectifier circuit 86 rectifies voltage output from a secondary winding 83 of the flyback transformer 80.

Similarly to the first embodiment, for example, the flyback transformer 80 has a hole 81b in the inner part of a corner 81a of the rectangular annular magnetic core 81. The flyback transformer 80 is provided with the detection winding 27 formed by inserting a wire into the hole 81b and winding the wire around the inner surface of the corner 81a. The controller 23 of the detector 20 is supplied with an induction voltage from the detection winding 27 amplified by the amplifier circuit 27a.

Turning on the switching element 85a of the primary circuit 85 applies a voltage to the primary winding 82 to store the power. Turning off the switching element 85a discharges the stored power from the secondary winding 83 and allows the rectifier circuit 86 to output a DC voltage. Turning on or off the switching element 85a changes a magnetic flux in the magnetic core 81 of the flyback transformer 80.

Figure 33:
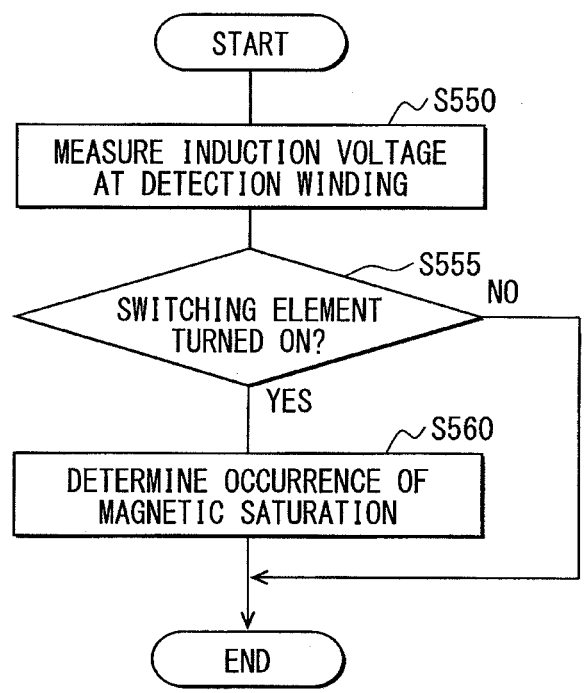
FIG. 33 is a flowchart showing a seventh determination process according to the fourth embodiment.

The controller 23 of the detector 20 detects magnetic saturation states of the magnetic core 81 based on the amount of the DC magnetic flux generated from the magnetic core 81. A seventh determination process to detect magnetic saturation states of the magnetic core 81 will be described with reference to a flowchart in FIG. 33. The controller 23 periodically performs the seventh determination process.

At S550, the controller 23 of the detector 20 measures an induction voltage at the detection winding 27 and passes control to S555. At S555, the controller 23 determines, based on an induction voltage change, whether the switching element 85a is turned on. The induction voltage change is specified from a result of measuring the induction voltage for a specified number of times. If the determination is affirmed (Yes at S555), the controller 23 passes control to S560. If the determination is negated (No at S555), the controller 23 terminates the process.

At S560, based on a measurement value for the induction voltage, the controller 23 detects an amount of the DC magnetic flux formed in the magnetic core 81. The controller 23 determines whether the amount of the DC magnetic flux reaches a specified level. If the determination is affirmed, the controller 23 determines that the magnetic core 81 is magnetically saturated and terminates the process.

Specifically, the controller 23 determines the amount of the DC magnetic flux as follows. The controller 23 normalizes the measurement value for the induction voltage using a voltage value of the DC power supply 85b of the primary circuit 85. The controller 23 then determines whether the normalized measurement value exceeds a specified threshold value. Obviously, the determination method or the threshold value depends on the arrangement position of the detection winding 27.

The position of the hole 81b and the arrangement method for the detection winding 27 are not limited thereto. The detection winding 27 may be placed to surround the outer surface of the corner 81a. The detection winding 27 may be configured as a double detection winding according to the second embodiment.

This enables to detect an occurrence of magnetic saturation on the magnetic core 81 of the flyback transformer 80 while restricting an increase in costs and a decrease in the magnetic core strength. The detected amount of the DC magnetic flux may be reflected on various controls concerning the flyback transformer 80.

(Fifth Embodiment)

Figure 34:
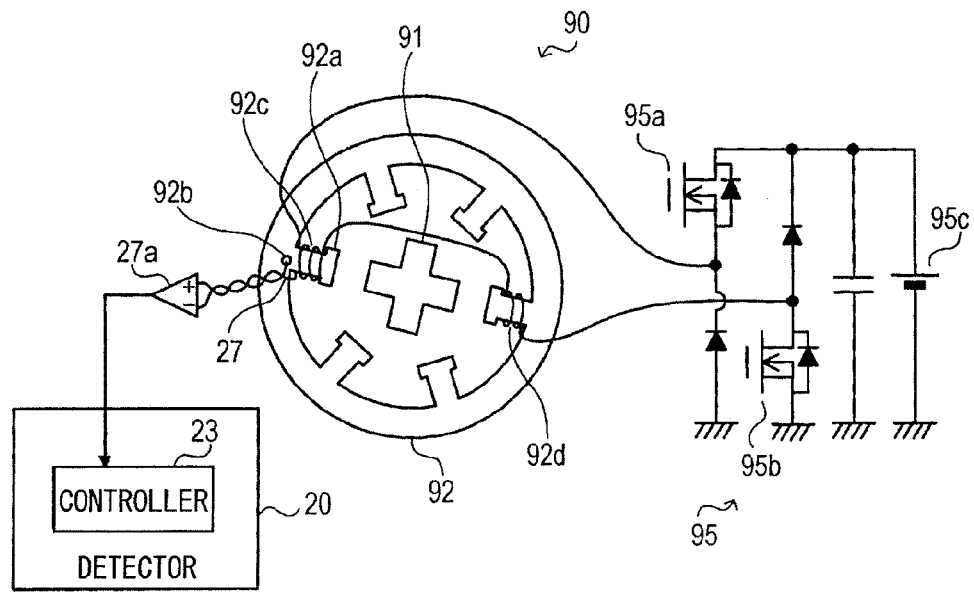
FIG. 34 is an explanatory diagram illustrating a configuration of a switched reluctance motor according to a fifth embodiment.

According to the fifth embodiment, the detector 20 estimates an amount of the DC magnetic flux at a stator magnetic pole 92a of a stator 92 of a switched reluctance motor 90 (see FIG. 34).

The stator 92 of the switched reluctance motor 90 is provided with a three-phase stator magnetic pole. A control circuit is provided to apply a voltage to a stator winding provided for the stator magnetic-pole corresponding to each phase and controls rotation of a rotor 91. FIG. 34 illustrates only a control circuit 95 corresponding to one phase of the three-phase stator magnetic pole and omits control circuits corresponding to the other phases.

The control circuit 95 is provided with first and second switching elements 95a and 95b and a DC power supply 95c. The DC power supply 95c supplies DC voltage to stator windings 92c and 92d provided for two stator magnetic poles whose phases are opposite to each other. When the first and second switching elements 95a and 95b are turned on, the DC power supply 95c supplies DC voltage to stator windings 92c and 92d to change a magnetic flux at the stator 92.

A hole 92b is formed to penetrate the root of the stator magnetic pole 92a corresponding to the control circuit 95 in FIG. 34. A wire is inserted into the hole 92b to provide the detection winding 27 for the stator magnetic pole 92a. The controller 23 of the detector 20 is supplied with an induction voltage from the detection winding 27 amplified by the amplifier circuit 27a.

Figure 35:
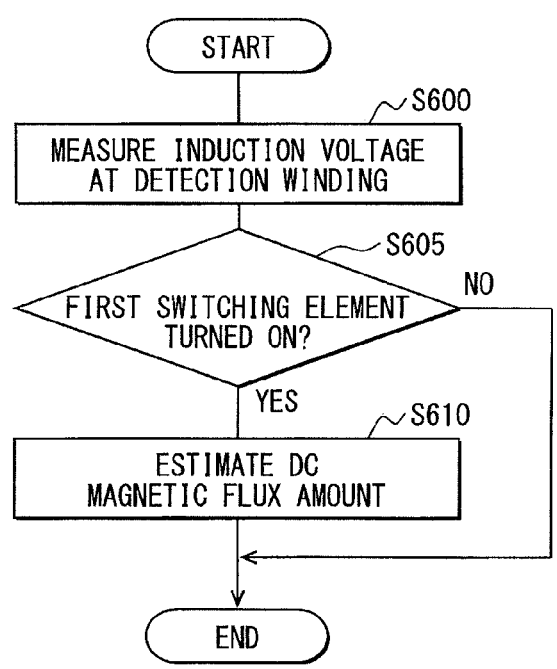
FIG. 35 is a flowchart showing an eighth determination process according to the fifth embodiment.

Based on the induction voltage from the detection winding 27, the controller 23 of the detector 20 detects an amount of the DC magnetic flux generated at the stator magnetic pole 92a. An eighth determination process to detect an amount of the DC magnetic flux generated at the stator magnetic pole 92a will be described with reference to a flowchart in FIG. 35. The controller 23 periodically performs the eighth determination process.

At S600, the controller 23 of the detector 20 measures an induction voltage at the detection winding 27 and passes control to S605. At S605, the controller 23 determines, based on an induction voltage change, whether the first switching element 95a is turned on. The induction voltage change is specified from a result of measuring the induction voltage for a specified number of times. If the determination is affirmed (Yes at S605), the controller 23 passes control to S610. If the determination is negated (No at S605), the controller 23 terminates the process.

At S610, based on a measurement value for the induction voltage, the controller 23 estimates the amount of the DC magnetic flux generated at the stator magnetic pole 92a and terminates the process. Specifically, the controller 23 normalizes the measurement value for the induction voltage using a voltage value of the DC power supply 95c of the control circuit 95. The controller 23 references the normalized value in a specified table to estimate the amount of the DC magnetic flux. Obviously, the table changes with arrangement positions of the detection winding 27.

The position of the hole 92b and the arrangement method for the detection winding 27 are not limited thereto. The detection winding 27 may be configured as a double detection winding according to the second embodiment, for example.

This enables to estimate a DC magnetic flux amount generated at the stator magnetic pole 92a of the switched reluctance motor 90 while restricting an increase in costs and a decrease in the magnetic core strength. It is possible to detect an occurrence of magnetic saturation based on the estimated DC magnetic flux amount and reflect the DC magnetic flux amount on various controls concerning the switched reluctance motor 90.

The same method can estimate amounts of the DC magnetic flux generated at stator magnetic poles for the other types of electric motors than the switched reluctance motor 90. It is possible to detect an occurrence of magnetic saturation based on the estimated amount of the DC magnetic flux and reflect the amount of the DC magnetic flux on various controls concerning the electric motors.

(Other Embodiments)

The transformer 10 in the insulated power supply 1 according to the first and second embodiments uses the rectangular annular magnetic core 11. The detection winding is provided for one of four corners each of which is bent at 90 degrees.

However, the transformer 10 may be replaced by a transformer that Includes an approximately rectangular annular magnetic core having four curved portions. In such a case, the detection winding can be provided for a curved portion of the magnetic core similarly to the first and second embodiments. A magnetic bias in the magnetic core can be detected based on an induction voltage from the detection winding.

If the curved portion is narrow, only increasing a degree of the bending can sufficiently increase the inhomogeneity in distribution of the magnetic flux density as described above. Otherwise, it is difficult to detect a magnetic bias based on an induction voltage in the detection winding provided at the location.

To solve this problem, the curved portion of the magnetic core is adjusted so that a value resulting from dividing the maximum curvature radius at the curved portion by the maximum width at the curved portion is smaller than or equal to a specified value. The specified value may be set based on the magnetic permeability of the magnetic core, for example. The specified value may be set to 2 as an example.

The maximum curvature radius of the curved portion may be replaced by an average curvature radius of the curved portion or a curvature radius corresponding to a magnetic flux passing through the center of the curved portion. The maximum width of the curved portion may be replaced by an average width. This can sufficiently increase the inhomogeneity in distribution of magnetic flux density at the curved portion. It is possible to easily detect a magnetic bias based on an induction voltage from the detection winding provided at the curved portion.

Similarly to the first and second embodiments, the detection winding may be provided for any part of a circular magnetic core in a toroidal transformer. A magnetic bias in the magnetic core may be detected based on an induction voltage from the detection winding.

The magnetic core in the toroidal transformer has a constant curvature radius and a constant width. The magnetic core may also be adjusted so that a value resulting from dividing the curvature radius by the width is smaller than or equal to a specified value. It is possible to easily detect a magnetic bias based on an induction voltage from the detection winding.

The first through fifth embodiments form the non-uniform cross section near the corner or the notch of the magnetic core of the transformer or near the projected portion of the stator of the switched reluctance motor, that is, at a location where the magnetic flux density distributes inhomogeneously due to the medium shape. The detection winding is provided to surround part of the non-uniform cross section. However, media having different magnetic permeability may be used for part of the magnetic core or the stator. In such a case, the non-uniform cross section may be formed near a boundary between the media.

A hole may be formed at this location. In addition, a detection winding may be inserted into the hole to surround a partial region of the non-uniform cross section formed at the location. In such a case, the detector 20 can perform any of the above-mentioned determination processes based on an induction voltage from the detection winding to detect a magnetic bias and the magnetic bias direction. The detector 20 can also perform the magnetic saturation elimination process, detect the magnetic saturation, and estimate an amount of the DC magnetic flux.

The insulated power supply 1 according to the first embodiment is provided with the inner detection winding 21 and the outer detection winding 22 toward the inner and the outer side of the magnetic core 11 of the transformer 10. The detector 20 may detect a magnetic bias in the magnetic core 11 based on a difference between induction voltages from the detection windings.

As described above, a difference between induction voltages from the detection windings is equal to a voltage from the entire double detection winding 28 according to the second embodiment. A method similar to the second embodiment can detect a magnetic bias and a magnetic bias direction and perform a magnetic saturation elimination process.

It is possible to improve the magnetic bias detection sensitivity and easily and reliably detect a magnetic bias similarly to the second embodiment. The third and fourth embodiments provide the examples of detecting DC magnetic fluxes generated at magnetic cores of the reactor 70 and the flyback transformer 80 and detecting the magnetic saturation based on the DC magnetic flux. The fifth embodiment provides the example of estimating DC magnetic flux generated at the stator magnetic pole of the switched reluctance motor 90 and performing various processes based on the DC magnetic flux. The disclosure is not limited thereto. A configuration similar to the detector 20 according to the embodiment can detect the magnitude of an alternating-current magnetic flux generated in the magnetic core of a transformer, for example.

The first, second, and fourth embodiments have described that a threshold value may be calculated based on the amplitude of AC voltage applied to the primary winding 12 and the amplitude may be used to normalize a measurement result for an induction voltage of the detection winding. If the magnetic core is provided with other windings such as a secondary winding, a voltage applied to the primary winding 12 may be replaced by a voltage applied to other windings or an induction voltage from the same.

[Correspondence to the Claims]

The following describes the correspondence between technical terms used for the description of the above-mentioned embodiments and those used for the appended claims.

The primary winding 12 or 62 according to the first embodiment is an example of a coil. The partial region 11$dx$ or 11$dy$ is an example of a detection region. The corner 11$a$ is an example of a curved portion. The amplifier circuits 21$a$ and 22$a$ are example of a conversion section. The comparison circuit 24 is an example of a detection winding measurement section. The inverting circuit 25 is an example of a polarity inversion section. The integrating circuit 26 is an example of a generation section.

The controller 23 may include a detection winding measurement section, a reference winding measurement section, a detection section, a polarity inversion section, and a stop section. The process at S205 in the first determination process may be performed by the detection winding measurement section or the reference winding measurement section. The process at S210 may be performed by detection section. The process at S255 in the second determination process may be performed by the detection winding measurement section. The processes at S265 and S270 may be performed by the detection section. The processes at S300 through S315 in the third determination process may be performed by the detection winding measurement section. The processes at S325 and S330 may be performed by the detection section.

The process at S375 in fourth determination process may be performed by the detection winding measurement section. The process at S380 may be performed by the detection section. The processes at S365 and S385 may be performed by the polarity inversion section. The process at S400 in fifth determination process may be performed by the detection winding measurement section. The processes at S415 through S425 may be performed by the detection section. The process at S450 in the first magnetic saturation elimination process may be performed by the detection winding measurement section or the reference winding measurement section. The processes at S455 and S460 may be performed by the detection section. The process at S465 may be performed by the stop section.

The corner 71$a$ in the third embodiment is an example of the curved portion. The process at 3500 in the sixth determination process may be performed by the detection winding measurement section. The process at S510 may be performed by the detection section. The primary winding 82 in the fourth is an example of the coil. The corner 81$a$ is an example of the curved portion. The process at 8550 in the seventh determination process may be performed by the detection winding measurement section. The process at S560 may be performed by the detection section.

The stator winding 92$c$ in the fifth embodiment is an example of the coil. The stator 92 is an example of the magnetic core. The process at S600 in the eighth determination process may be performed by the detection winding measurement section. The process at S610 may be performed by the detection section.

What is claimed is:

1. A detector for detecting a magnetic bias, a magnetic saturation, or an amount of magnetic flux in a magnetic core around which a coil is wound, wherein when the coil is applied with a voltage to form a magnetic flux, inhomogeneity in distribution of magnetic flux density occurs in a non-uniform cross section of the magnetic core, and the magnetic core has a hole that penetrates the magnetic core along the non-uniform cross section, the detector comprising:

a detection winding including a wire, the wire inserted into the hole that penetrates the magnetic core and surrounding a periphery of a detection region, the detection region being a part of the non-uniform cross section and having a magnetic flux density different from an average magnetic flux density of the non-uniform cross section;

a detection winding measurement section performs a measurement relating to an electromotive force induced by the detection winding; and a detection section detecting the magnetic bias, the magnetic saturation, or the amount of the magnetic flux in the magnetic core based on a measurement result of the detection winding measurement section, wherein the magnetic core has a non-uniform shape such that when the coil is applied with the voltage to form the magnetic flux, a larger inhomogeneity portion is formed in the magnetic core where inhomogeneity in distribution of magnetic flux density in cross section is larger than that of an other portion of the magnetic core, and wherein the non-uniform cross section is defined in the larger inhomogeneity portion.

2. The detector according to claim 1, wherein the magnetic core has one or a plurality of the holes along the non-uniform cross section, wherein the detection region includes a first region and a second region formed in the same non-uniform cross section, wherein the wire included in the detection winding winds around peripheries of the first region and the second region, and wherein the wire winds along the periphery of the first region in a predetermined direction and winds along the periphery of the second region in a direction opposite from the predetermined direction.

3. The detector according to claim 2, wherein the detection winding measurement section performs the measurement relating to the electromotive force when the voltage is applied to the coil, and wherein the detection section detects an occurrence of the magnetic bias or the magnetic saturation in the magnetic core based on the electromotive force measured by the detection winding measurement section and a threshold value.

4. The detector according to claim 3, wherein the wire included in the detection winding winds around the first region and the second region for one or a plurality of turns along the peripheries of the first region and the second region, and wherein the number of turns to wind the wire around the first region and the number of turns to wind the wire around the second region are adjusted so that the threshold value used by the detection section is equal to zero potential.

5. The detector according to claim 1, wherein the magnetic core has an annular shape and includes a curved portion, and wherein the non-uniform cross section is a cross section in the curved portion.

6. The detector according to claim 5, wherein the curved portion is bent at 90 degrees or less.

7. The detector according to claim 5, wherein the periphery of the detection region is partially in contact with inner or outer external surface of the curved portion.

8. The detector according to claim 7, wherein the detection winding includes an inner detection winding and an outer detection winding, wherein the detection region includes an inner detection region whose periphery is partially in contact with the inner external surface of the curved portion and an outer detection region whose periphery is partially in contact with the outer external surface of the curved portion, wherein the inner detection winding includes a wire winding around the inner detection region, wherein the outer detection winding includes a wire winding around the outer detection region, wherein the detection winding measurement section performs the measurement relating to the electromotive force by comparing a value reflecting an inner electromotive force induced by the inner detection winding and a value reflecting an outer electromotive force induced by the outer detection winding and measuring a determination period during which the value reflecting the outer electromotive force is larger than the value reflecting the inner electromotive force, and wherein, based on the measurement result of the detection winding measurement section, the detection section detects an occurrence of the magnetic bias in the magnetic core by comparing a length of the determination period after a beginning of an application period to apply the voltage to the coil with a length of the determination period before the end of the application period.

9. The detector according to claim 1, wherein the detection winding measurement section performs the measurement relating to the electromotive force when the voltage is applied to the coil, and wherein the detection section detects an occurrence of the magnetic bias or the magnetic saturation in the magnetic core based on the electromotive force measured by the detection winding measurement section and a threshold value.

10. The detector according to claim 9, further comprising a stop section, wherein, when the voltage is applied to the coil, the detection section determines whether a degree of magnetic saturation in the detection region reaches a predetermined level, and the detection section detects an occurrence of the magnetic saturation in the magnetic core when the degree of magnetic saturation reaches the predetermined level, and wherein the stop section stops application of the voltage to the coil when the detection section detects the occurrence of the magnetic saturation.

11. The detector according to claim 9, further comprising:

a reference winding including a wire that winds around an external surface of the magnetic core; and a reference winding measurement section measuring a reference electromotive force induced by the reference winding, wherein the detection section detects an occurrence of the magnetic bias or the magnetic saturation in the magnetic core further based on the reference electromotive force measured by the reference winding measurement section.

12. The detector according to claim 1, wherein the detection winding measurement section performs the measurement relating to the electromotive force immediately after a beginning of an application period to apply the voltage to the coil and immediately before an end of the application period, and wherein the detection section detects an occurrence of the magnetic bias in the magnetic core by comparing a value reflecting the electromotive force measured immediately after the beginning of the application period with a value reflecting the electromotive force measured immediately before the end of the application period.

13. The detector according to claim 1, further comprising:

a polarity inversion section; and a generation section, wherein an application period to apply the voltage to the coil is bisected into a first half period and a second half period, wherein one of the first half period and the second half period is set to an inverting period and the other of the first half period and the second half period is set to a non-inverting period, wherein the polarity inversion section inverts a polarity of a value reflecting the electromotive force induced by the detection winding during the inverting period, wherein the generation section generates an integral signal that is an integrated value of the electromotive force induced during the non-inverting period and the electromotive force induced during the inverting period with its polarity inverted by the polarity inversion section, wherein the detection winding measurement section performs the measurement relating to the electromotive force by measuring the integral signal when the application period ends, and wherein the detection section detects an occurrence of the magnetic bias in the magnetic core based on a value of the integral signal measured by the detection winding measurement section.

14. The detector according to claim 1, further comprising:
a generation section generating an integral signal by excluding a direct-current component from an integrated value of the induced electromotive force, wherein the coil is supplied with a voltage that changes periodically and has the same amplitude in positive and negative directions, wherein, in each cycle, a length of an application period to apply the voltage in the positive direction to the coil is approximately equal to a length of an application period to apply the voltage in the negative direction to the coil, wherein the detection winding measurement section performs the measurement of the electromotive force by measuring a value of the integral signal, and wherein the detection section specifies maximum and minimum values of the integral signal based on a measurement result of the detection winding measurement section and detects an occurrence of the magnetic bias in the magnetic core based on the maximum and minimum values.

15. The detector according to claim 1,
wherein the detection winding measurement section measures the electromotive force when the voltage is applied to the coil, and
wherein the detection section detects the amount of the magnetic flux in the magnetic core based on a measurement result of the detection winding measurement section.

16. The detector according to claim 15,
wherein the magnetic core is used as a stator for an electric motor.

17. The detector according to claim 15,
wherein the magnetic core is provided in a reactor or a flyback transformer.

18. The detector according to claim 1,
wherein the detection region is referred to as a first magnetic flux density area, and the non-uniform cross section includes a second magnetic flux density area, and
wherein the second magnetic flux density area is opposite to the first magnetic flux density area with respect to the hole and has a magnetic flux density different from the magnetic flux density of the first magnetic flux density area when the coil is applied with the voltage.

19. The detector according to claim 1,
wherein the magnetic core has a ring shape surrounding a hollow, and
wherein the hole is located on an outer side of the magnetic core away from the hollow.

20. The detector according to claim 1,
wherein the magnetic core has a curved portion bent at 90 degrees or less, and
wherein the non-uniform cross section passes through an edge of the curved portion.

21. The detector according to claim 20,
wherein the magnetic core has a rectangular annular shape including the curved portion.

22. The detector according to claim 1,
wherein the magnetic core has a notch, and
wherein the non-uniform cross section passes through an edge of the notch.

23. The detector according to claim 22,
wherein the magnetic core is employed in a planar transformer.

24. A detector for detecting a magnetic bias, a magnetic saturation, or an amount of magnetic flux, the detector comprising:
a magnetic core;
a coil wound around the magnetic core and applied with a voltage to form a magnetic flux in the magnetic core;
a detection winding inducing an electromotive force when the coli is applied with the voltage to form the magnetic flux;
a detection winding measurement section measuring the electromotive force induced by the detection winding; and
a detection section detecting a magnetic bias, a magnetic saturation or an amount of the magnetic flux in the magnetic core based on a measurement result of the detection winding measurement section, wherein the magnetic core has a non-uniform shape that causes a larger inhomogeneity portion in which inhomogeneity in distribution of magnetic flux density in cross section is larger than that of an other portion of the magnetic core when the coil is applied with the voltage to form the magnetic flux, wherein the non-uniform cross section is defined in the larger inhomogeneity portion, wherein the magnetic core has a hole that penetrates the magnetic core along the non-uniform cross section, wherein the detection winding is inserted into the hole and surrounding a periphery of a detection region that is a part of the non-uniform cross section, and wherein the detection region has a magnetic flux density different from an average magnetic flux density of the non-uniform cross section.

25. The detector according to claim 24,
wherein the magnetic core has a curved portion bent at 90 degrees or less, and
wherein the non-uniform cross section passes through an edge of the curved portion.

26. The detector according to claim 25,
wherein the magnetic core has a rectangular annular shape including the curved portion.

27. The detector according to claim 24,
wherein the magnetic core has a notch, and
wherein the non-uniform cross section passes through an edge of the notch.

28. The detector according to claim 27,
wherein the magnetic core is employed in a planar transformer.

\* \* \* \* \*